(12) United States Patent
Ruess et al.

(10) Patent No.: US 7,547,648 B2
(45) Date of Patent: Jun. 16, 2009

(54) FABRICATING NANOSCALE AND ATOMIC SCALE DEVICES

(75) Inventors: Frank J. Ruess, Randwick (AU); Lars Oberbeck, Coogee (AU); Michelle Yvonne Simmons, Coogee (AU); K. E. Johnson Goh, Singapore (SG); Alexander Rudolf Hamilton, Forestville (AU); Mladen Mitic, Ryde (AU); Rolf Brenner, Chatswood (AU); Neil Jonathan Curson, Randwick (AU); Toby Hallam, Newtown (AU)

(73) Assignee: Qucor Pty Ltd (AU)

( * ) Notice: Subject to any disclaimer, the term of this patent is extended or adjusted under 35 U.S.C. 154(b) by 523 days.

(21) Appl. No.: 10/568,559

(22) PCT Filed: Aug. 20, 2004

(86) PCT No.: PCT/AU2004/001118

§ 371 (c)(1),
(2), (4) Date: Feb. 16, 2006

(87) PCT Pub. No.: WO2005/019095

PCT Pub. Date: Mar. 3, 2005

(65) Prior Publication Data

US 2006/0275958 A1   Dec. 7, 2006

(30) Foreign Application Priority Data

Aug. 20, 2003 (AU) .............................. 2003904492
Apr. 22, 2004 (AU) .............................. 2004902143

(51) Int. Cl.
*H01L 21/00* (2006.01)

(52) U.S. Cl. ............................. 438/975; 257/E23.179
(58) Field of Classification Search .................. 438/975
See application file for complete search history.

(56) References Cited

U.S. PATENT DOCUMENTS 3,715,242 A * 2/1973 Daniel ......................... 438/14

(Continued)

FOREIGN PATENT DOCUMENTS

JP          2000-150358 A          5/2000

(Continued)

OTHER PUBLICATIONS

T. Schenkel, "Single ion implantation for solid state quantum computer development," J. Vac. Sci. Technol. B. (20(6), Nov./Dec. 2002, pp. 2819-2833, AVS, New York, NY.

*Primary Examiner*—Wai-Sing Louie
(74) *Attorney, Agent, or Firm*—Wood, Phillips, Katz, Clark & Mortimer

(57) ABSTRACT

This invention concerns the fabrication of nanoscale and atomic scale devices. The method involves creating one or more registration markers. Using a SEM or optical microscope to form an image of the registration markers and the tip of a scanning tunnelling microscope (STM). Using the image to position and reposition the STM tip to pattern the device structure. Forming the active region of the device and then encapsulating it such that one or more of the registration markers are still visible to allow correct positioning of surface electrodes. The method can be used to form any number of device structures including quantum wires, single electron transistors, arrays or gate regions. The method can also be used to produce 3D devices by patterning subsequent layers with the STM and encapsulating in between.

31 Claims, 31 Drawing Sheets

U.S. PATENT DOCUMENTS 5,777,975 A * 7/1998 Horinouchi et al. .... 369/112.19
2003/0137510 A1 * 7/2003 Massen ...................... 345/420

FOREIGN PATENT DOCUMENTS

| WO | WO 02/19036 A1 | 3/2002 |
| WO | WO 03/019635 A1 | 3/2003 |
| WO | WO 03/081687 A2 | 10/2003 |

* cited by examiner

PART I

PART II

FABRICATING NANOSCALE AND ATOMIC SCALE DEVICES

TECHNICAL FIELD

This invention concerns the fabrication of nanoscale and atomic scale devices, that is electronic devices fabricated to nanometer or atomic accuracy. Such devices could be intermediate devices in the fabrication of a quantum computer, but could have many other uses. In a further aspect the invention concerns the devices themselves.

BACKGROUND ART

It is known that the Scanning Tunnelling Microscope (STM) can not only image at the atomic scale, but can also be used to manipulate matter at the atomic scale. Research groups are therefore interested in using a STM to fabricate atomic scale semiconductor devices, and very recently it has been shown that it is possible to use a STM to pattern P donors in silicon with atomic precision[5].

It is desirable to connect macroscopic leads to a buried nano or atomic-scale patterned conducting region made with a STM once it is removed from the vacuum environment. A difficulty arises when the patterned conducting region is not visible, for instance it may be encapsulated under several tens to hundreds of nanometers of silicon and therefore be invisible to optical and electron beam microscopes. In this case, the challenge is to find a way to register the, perhaps atomically accurate, patterned conducting region to the silicon surface.

Many groups across the world have tried to develop a functional registration process for making accurate electrical contact and control gate electrodes to individual buried STM fabricated structures. To date none have succeeded.

A number of papers relevant to the working of this invention are cited below and these are also incorporated herein by reference:

[1] L. Oberbeck, T. Hallam, N. J. Curson, M. Y. Simmons and R. G. Clark, Appl. Surf. Sci. 212-213, 319 (2003).
[2] J. W. Lyding, T. Shen, J. S. Hubacek, J. R Tucker, and G. Abeln, Appl. Phys. Lett. 64, 2010 (1994).
[3] J. R. Tucker and T. C. Shen, Solid-State Electron. 42, 1061 (1998).
[4] J. L. O'Brien, S. R. Schofield, M. Y. Simmons, R. G. Clark, A. S. Dzurak, N. J. Curson, B. E. Kane, N. S. McKalpine, M. E. Hawley, and G. Brown, Phys. Rev. B 64, 161401 (2001).
[5] S. R. Schofield, N. J. Curson, M. Y. Simmons, F. J. Rueβ, T. Hailam, L. Oberbeck, and R. G. Clark, Phys. Rev. Lett. 91, 136104 (2003).
[6] T. C. Shen, J. Y. Ji, M. A. Zudov, R. R. Du, J. S. Kine, and J. R. Tucker, Appl. Phys. Lett. 80, 1580 (2002).
[7] L. Oberbeck, N. J. Curson, M. Y. Simmons, R. Brenner, A. R. Hamilton, S. R. Schofield, and R. G. Clark, Appl. Phys. Lett. 81, 3197 (2002).
[8] J. E. Vasek, Z. Zhang, C. Salling, and M. Lagally, Phys. Rev. B. 51, 17207 (1995).
[9] J. J. Boland, Phys. Rev. Lett. 67, 1539 (1991).
[10] E. Hill, B. Freelon, and E. Ganz, Phys. Rev. B 60, 15896 (1999).
[11] H. Nakazawa, M. Suemitsua, and N. Miyamoto, Surf. Sci. 465, 177 (2000).
[12] M. Dürr, A. Biedermanm, Z. Hu, U. HÖfer, and T. F. Heinz, Science 296, 1838 (2002).
[13] D. R. Bowler, J. H. G. Owen, C. M. Goringe, K. Mild, and G. A. D. Briggs, J. Phys. Cond. Matt. 12, 7655 (2000).
[14] B. S. Swartzentruber, Y. W. Mo, M. B. Webb, and M. G. Lagally, J. Vac. Sci. Technol. A 7, 2901 (1989).
[15] R. J. Hamers, R. M. Tromp, and J. E. Demuth, Phys. Rev. B 34, 5343 (1986).
[16] E. J. Buehler and J. J. Boland, Surf. Sci. 425, L363 (1999).
[17] Y. Wang, M. J. Bronikowski, and R. J. Hamers, J. Vac. Sci. Technol. A. 12, 2051 (1994).
[18] D. P. Adams, S. M. Yalisove, and D. J. Eaglesham, Appl. Phys. Lett. 63, 3571 (1997).
[19] M. L. N. Kitamira and M. Webb, Phys. Rev. Lett. 71, 2082 (1993).
[20] R. N. A. Natori and H. Yasunaga, Surf. Sci. 397, 71 (1998).
[21] E. Kim, C. Chen, T. Pang, and Y. H. Lee, Phys. Rev. B. 60, 8680 (1999).
[22] Y. Wang, X. Chen, and R. J. Hamers, Phys. Rev. B 50, 4534 (1994).
[23] F. J. Rueβ, L. Oberbeck, M. Y. Simmons, K. E. J. Goh, A. R. Hamilton, T. Hallam, N. J. Curson, and R. G. Clark, *Submitted to Nano Letters* (2004).
[24] D.-S. Lin, T.-S. Ku, and R.-P. Chen, Phys. Rev. B 61, 2799 (2000).
[25] G. Bergmann, *Phys. Rep.* 107, 1 (1984).
[26] S. Hikami, A. I. Larkin, Y. Nagaoka, *Prog. Theor. Phys.* 63, 707 (1980).
[27] R. Tucker, T.-C. Shen, *Int. J. Circ. Theor. Appl.* 28, 553 (2000).
[28] G. L. Snider, *J. Appl. Phys.* 85, 4283 (1999).
[29] J. C. Kim, J.-Y. Ji, J. S. Kline, J. R. Tucker, T.-C. Shen, *Surf Sci.* 538, L471 (2003).
[30] G. E. Moore, Electronics 38, 114 (1965).
[31] see e.g. S. M. Sze, *Semiconductor Devices—Physics and Technology* (John Wiley & Sons, New York, 1985).
[32] P. M. Fahey, P. B. Griffin and J. D. Plummer, Rev. Mod. Phys. 61, 289 (1989).
[33] J. F. Nützel and G. Abstreiter, Phys. Rev. B 53, 13551 (1996).
[34] E. Friess, J Nützel and G. Abstreiter, Appl. Phys. Lett. 60, 2237 (1992).
[35] K. D. Hobart, F. J. Kub, G. G. Jernigan and P. E. Thompson, J. Vac. Sci. Technol. B 14, 2229 (1996).
[36] R. G. Wilson, F. A. Stevie and C. W. Magee, *Secondary Ion Mass Spectrometry* (John Wiley & Sons, New York, 1989).
[37] J. F. Nützel and G. Abstreiter, Phys. Rev. B 53, 13551 (1996).
[38] S. Hikami, A. I. Larkin, and Y. Nagaoka, Prog. Theor. Phys. 63, 707 (1980).
[39] B. L. Altshuler, A. G. Aronov, A. I. Larkin, and D. E. Khmel'nitskii, Sov. Phys. JETP 54, 411 (1981).
[40] Palasantzas, G.; Ilge, B.; Rogge, S.; Geerlings, L. J. Microelectron. Eng. 1999, 46, 133.
[41] Dunn, A. W.; Cotier, B. N.; Nogaret, A., Moriarty, P.; Beton, P. H. Appl. Phys. Lett. 1997, 71, 2937.
[42] Hul'ko, O. V.; Boukherroub, R., Lopinski, G. P. J. Appl. Phys. 2001, 90, 1655.
[43] Hersam, M. C.; Abeln G. C.; Lyding, J. W. Microelectron. Eng. 1997, 47, 235.

SUMMARY OF THE INVENTION

The invention is a method for fabricating a nanoscale or atomic scale device, comprising the steps of:

Creating one or more registration markers visible to a Scanning Tunnelling Microscope (STM), Scanning Electron Microscope (SEM) or an optical microscope, on or in a (clean) silicon surface.

Using a SEM or optical microscope to form an image of at least one of the registration markers and the tip of a Scanning tunnelling Microscope (STM) in the vicinity of the registration marker.

Using the image to position and reposition the STM tip relative to the marker with nanometer or micron resolution in order to pattern the active (conducting or insulating region) of the device structure on the silicon surface.

Forming the device (by incorporating dopant or insulating atoms or molecules into pattern) and then encapsulating it with silicon such that one or more of the registration markers are still visible on the silicon surface to a SEM or optical microscope.

Depositing a metal layer onto the silicon surface using either optical or electron beam lithography to form one or more ohmic or gate electrodes, or both, at one or more locations positioned relative to respective registration markers.

The registration markers survive all the process steps involved in the fabrication of the device. These steps might include flashing the surface to temperatures >1000° C., terminating the surface with a monolayer of hydrogen, selectively desorbing hydrogen atoms with either the STM tip with or without a scanning electron microscope (SEM) to pattern the device structure, dosing the exposed silicon surface with a dopant containing source, such as phosphine gas and encapsulating the resulting device. The invention is able to produce a robust semiconductor device, where the active component of the device is patterned by the STM. Given that we have also recently demonstrated that it is possible to dope silicon with atomic precision with a STM, the door is now open to the creation of fully functional nano and atomic scale silicon devices with both ohmic and control gate electrodes. This promises to open entirely new areas of quantum device physics, due to the ability to accurately control the position of dopants with atomic precision, and integrate quantum physics into device design (with applications for atomic-scale transistors, stub tuners, resonant tunnel diodes, etc).

The silicon surface may be the (100)-oriented surface having a 2×1 unit cell surface structure with rows of σ-bonded silicon dimers. In this case the dopant atoms replace silicon atoms in the surface to form dopant-silicon hetero-dimers.

The silicon surface may be up to 1 cm$^2$ in size allowing the STM patterned device to be compatible with either optical or electron beam lithography once it is removed from the vacuum system. In this case the STM system has to be compatible with achieving atomic resolution imaging and manipulation on a silicon sample that is up to 1 cm$^2$ in size.

The registration markers may be defined by optical or e-beam lithography (EBL).

The registration markers may be created using focussed ion beam (FIB) milling or etching of the silicon surface. Alternatively, they may be created using wet-chemical etching or reactive ion etching (RIE). The registration markers may alternatively be created by depositing metal onto the silicon surface, for instance to produce a thin metal pad.

The markers may be sized between a few nm and several microns. A series of registration marker of different sizes and patterns may be used to form a target around a selected site for the nanoscale device. The smallest marker may range from tens to several hundred nanometers in diameter. The registration markers may be from tens to several hundred nanometers deep.

After patterning the markers into the substrate the surface may be thoroughly cleaned to remove any traces or organic resists before loading into the STM vacuum system. The samples sizes, which are up to 1 cm$^2$, are then heated up to reconstruct the silicon surface with atomic-resolution.

A laser interferometer stage may be used to assist with repositioning of the STM over millimeter distances with nanometer resolution to expose the device structure in the hydrogen monolayer or to refind the device at any stage of the ultra-high vacuum fabrication process.

The structure may be exposed by selectively desorbing from a hydrogen monolayer on the silicon surface single or multiple H atoms spaced apart from each other by spacings from several hundred nanometers down to the order of the Fermi electron wavelength or below. The desorbed atoms may form wires, arrays, tunnel junctions and the process has the flexibility to form any number of device patterns, both in two and three dimensions. The exposed silicon may subsequently be doped by exposure to atoms or molecules containing dopant atoms; for instance phosphine gas may be used to dope with phosphorus donor atoms.

The dopant atoms may be activated by annealing the surface at between about 300° C. and about 650° C. to incorporate electrically active dopant atoms into the silicon.

The hydrogen monolayer may be removed by annealing at ~470±30° C. for less than 10 seconds, and preferably for 5 seconds. These two annealing steps may be combined, in which case annealing takes place at about 530° C. for about 5 seconds.

Alternatively, the hydrogen monolayer may be removed by using the STM tip, for instance with tunnelling conditions in the range of 4-7 V and 1-4 nA or by using the SEM with conditions for SEM hydrogen removal, that is electron beam current ranging from 1-4 nA and beam exposure times varying from several minutes to an hour.

Alternatively again the hydrogen monolayer may remain on the surface.

The encapsulating layers may be epitaxially grown at between about 0° C. and 400° C., between about 0° C. and 250° C. or preferably at room temperature to prevent diffusion of the donor atoms. The encapsulating layers may be between 5 and several hundred nm thick.

The method may include the further step of: thermally annealing the surface so that it becomes atomically smooth.

The method may include the step of depositing metal layers on the silicon surface at locations positioned above respective highly-doped regions and then performing an anneal step to diffuse the metal down to the buried P-doped regions, forming ohmic electrical contacts. This anneal must be at a sufficiently low temperature (typically less than ~500° C.) so that significant P diffusion does not occur out of the precision buried active region itself and therefore must involve a metal which has a much higher diffusion rate in silicon than the buried phosphorus. A possible specific process would use aluminium via metal deposition, followed by an anneal at 350° C. for 15 minutes to diffuse the aluminium down to the buried active region.

An alternative process for realisation of ohmic contacts would be to use ion implantation of n-type dopants in silicon (such as phosphorus) to create a shallow n-doped region, extending from the surface down to the active region. Localization of the implants could be achieved either through the use of a focused ion beam (FIB), or by a blanket ion implanter and a patterned ion-stopping resist mask, using a resist material such as polymethyl-methacrylate (PMMA). This process would require a relatively high temperature anneal step (possibly up to 950° C.) to remove ion damage which would need to be sufficiently short in time to avoid diffusion of the P atoms in the buried active region. Such rapid thermal anneal steps are common in commercial semiconductor device fabrication.

A critical aspect for realisation of ohmic contacts is to ensure alignment of the surface metallisation to the buried P-doped regions below. Surface metal and control-gate contacts only need to be registered to the buried active region to an accuracy of between 100-1000 nm, sufficient to ensure an overlap of the connecting regions. This level of registration can be achieved using the registration marks which are defined in the silicon substrate prior to STM lithography, and which can subsequently be imaged either optically or using scanning electron microscopy to allow for alignment of surface features to the markers.

The method may further comprise the steps of forming highly-doped gate regions close to and in the plane of the patterned dopant layers.

The method may also comprise the steps of forming three dimensional devices by patterning a first layer of the device, then overgrowing with one or more layers of silicon atoms and patterning the new surface with another layer of the device. This process can be repeated as long as a registration marker survives. Alternatively, new registration marker may be created close to or over the top of existing markers in order to ensure a marker is visible for depositing the metal layer.

The method may include the further step of measuring the electrical activity of the device.

Dopant atoms incorporated into the silicon surface may form buried qubit sites. In this case the method may further comprise the steps of forming first highly-doped gate regions adjacent respective qubit sites, each operable as a control gate for the qubit; and forming second highly-doped electrode regions adjacent respective qubit sites, each operable as a coupling electrode to read-out the qubit. Further, the metal layer may be deposited on the silicon surface at locations positioned above respective highly-doped regions to form electrical circuitry components, and there may be ohmic contact between each electrical circuitry component and the respective highly-doped region.

In a further aspect the invention is a nanoscale or atomic scale device fabricated by the method.

BRIEF DESCRIPTION OF THE DRAWINGS

Aspects and examples of the invention will now be described with reference to the following accompanying drawings, in which.

For the sake of brevity, in the following we will use the term nanoscale to refer to both nanoscale and atomic scale devices.

BEST MODES OF THE INVENTION

The Fabrication Approach

Figure 1A:
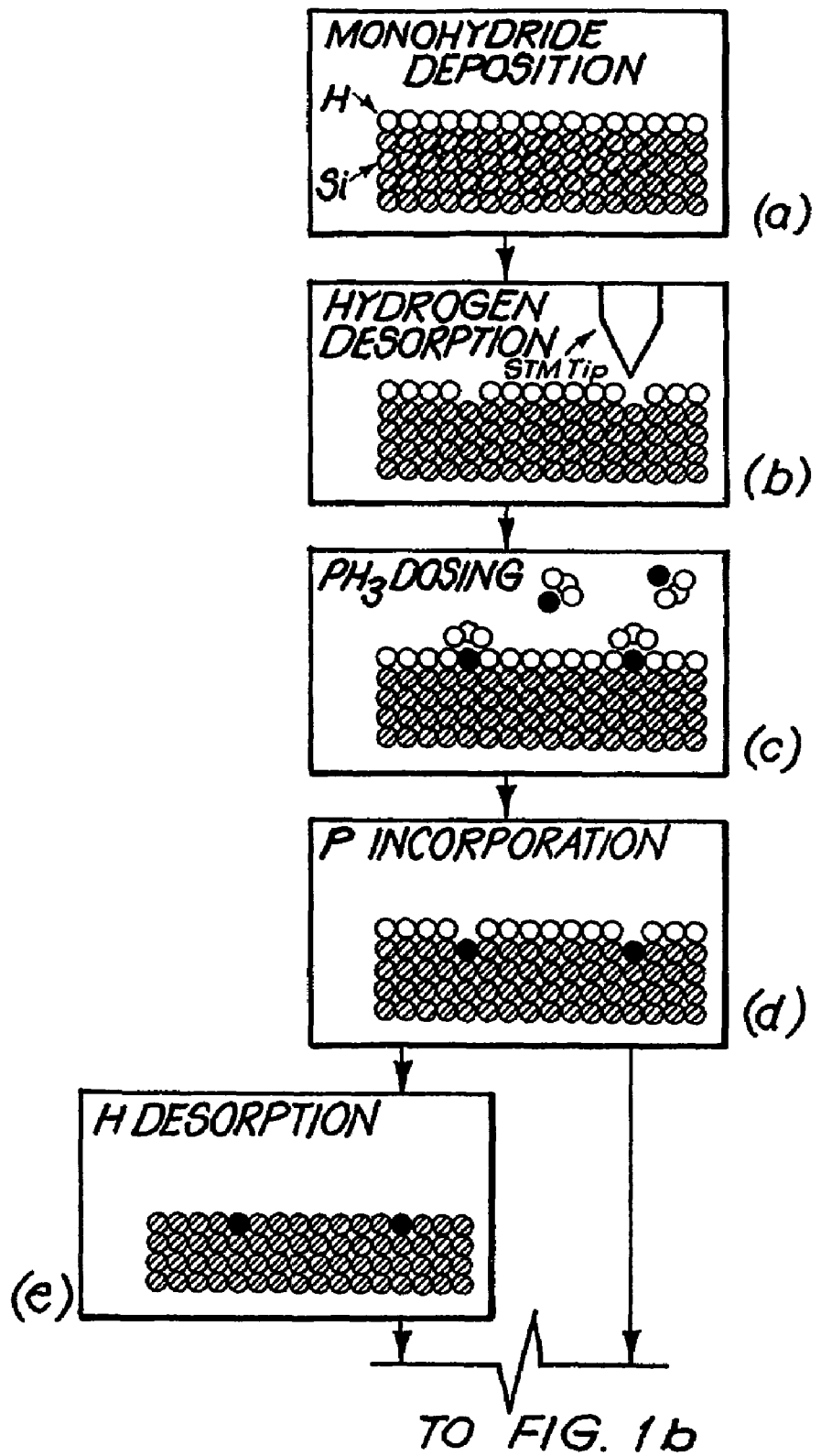
FIG. 1A(a) to (e) and FIG. 1B(f) to (k) are diagrams showing a series of eleven steps for the STM patterning of atomic and nanoscale structures on the silicon surface leading to the formation of a few qubit quantum computer.
Figure 1B:
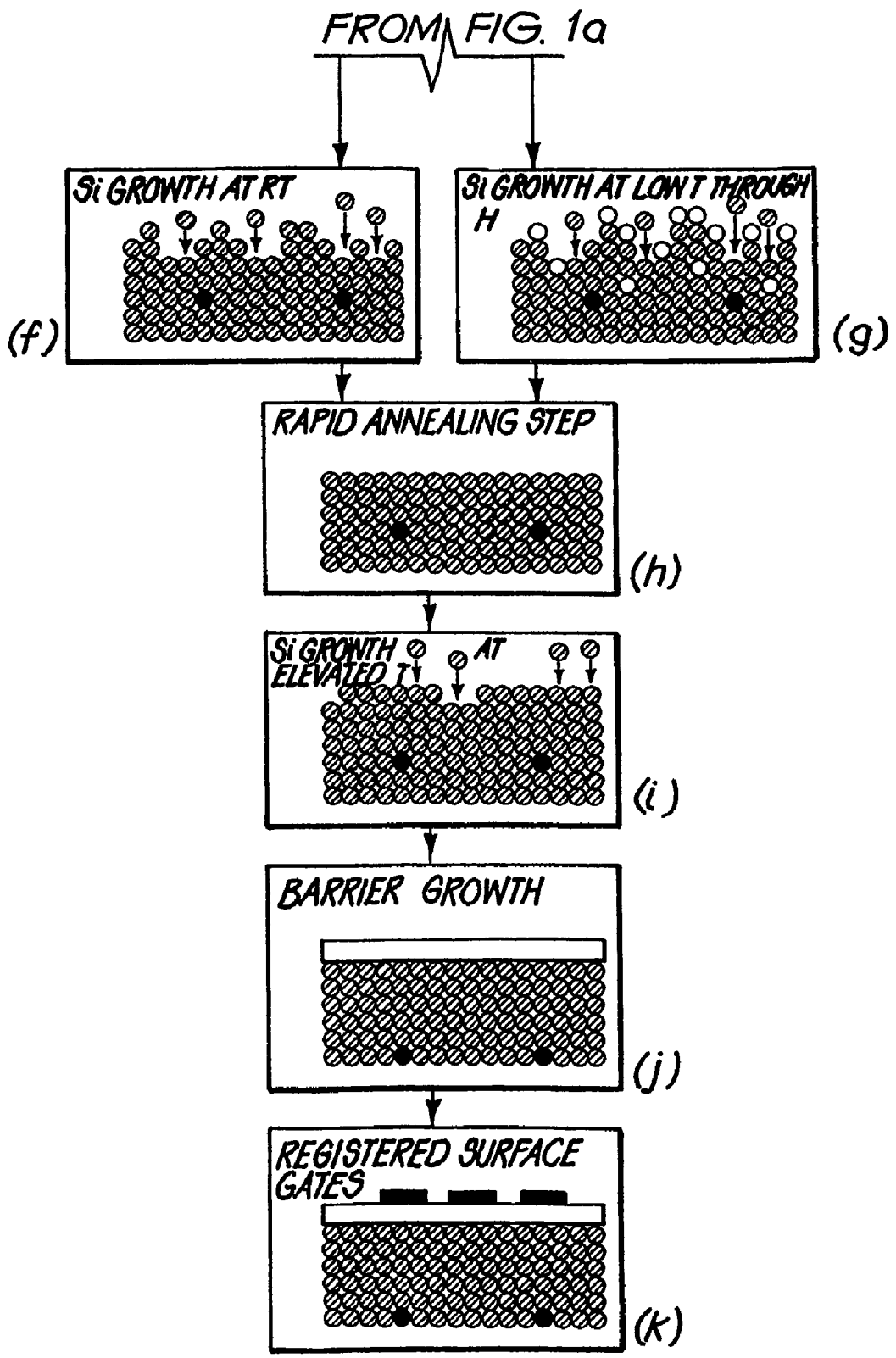
Figure 2:
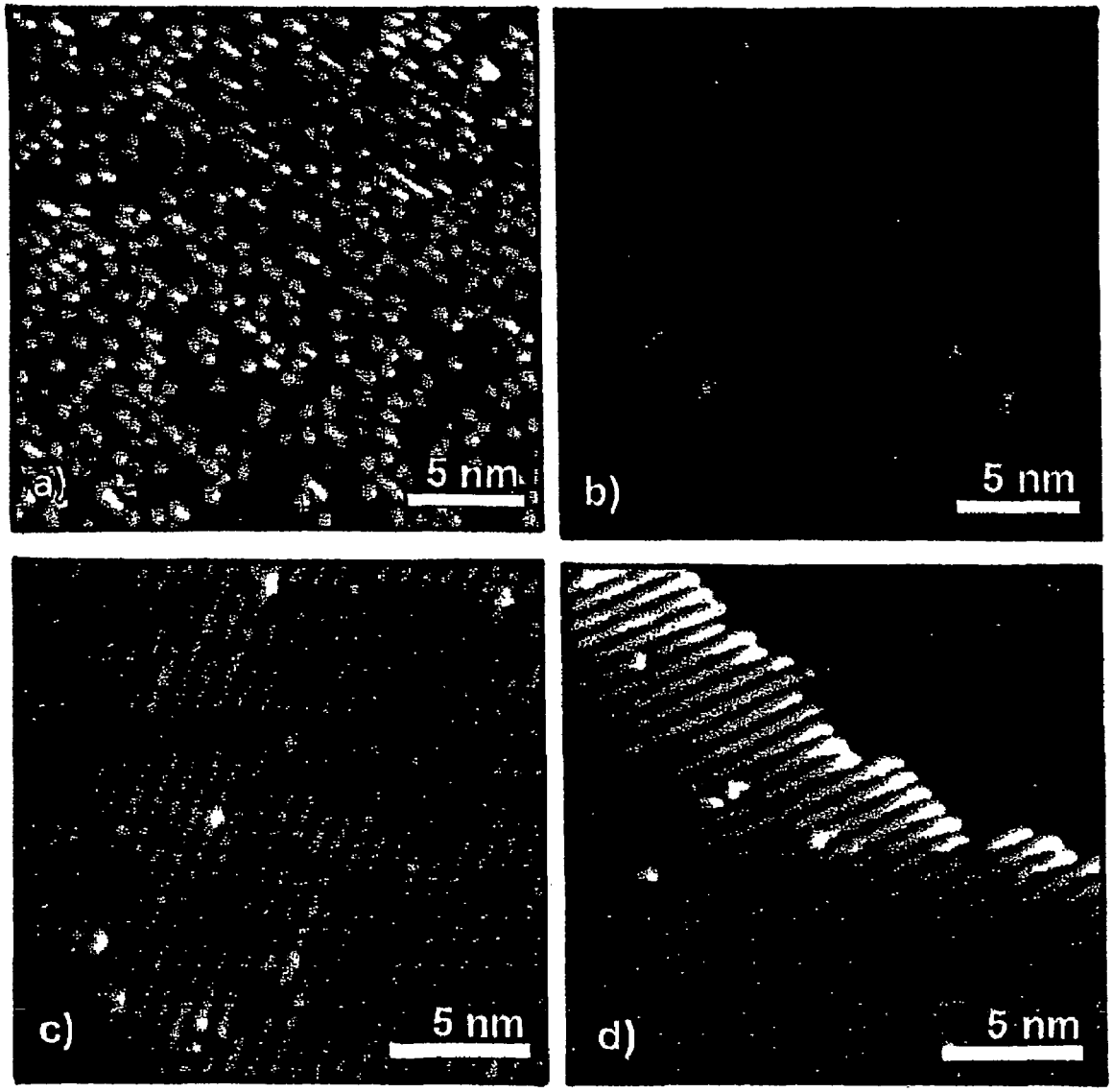
FIG. 2(a) to (d) are a series of filled state STM images of a hydrogen terminated surface following annealing at different temperatures and for different time periods.
Figure 3:
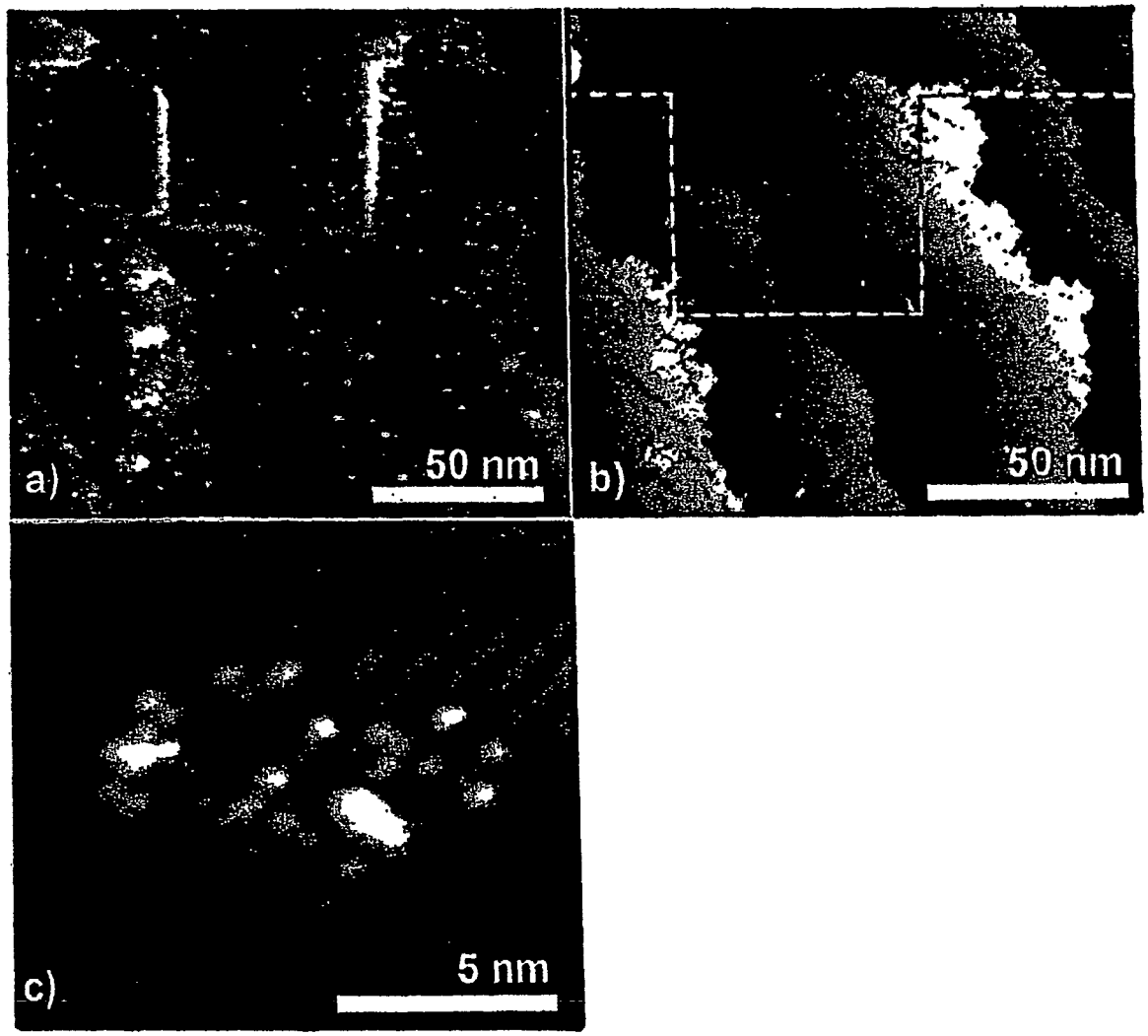
FIG. 3(a) to (c) are a series of STM images of a surface, showing deposited phosphine at (a), after annealing at 350° C. for 10 seconds at (b), and a detail at (c).

Referring first to FIGS. 1A and 1B, an outline of the main processing steps of a fabrication strategy for a quantum computing device will be described.

A clean Si(100)2×1 surface is formed in an ultra-high-vacuum (UHV) by heating to near the melting point. This surface has a 2×1 unit cell and consists of rows of σ-bonded Si dimers with the remaining dangling bond on each Si atom forming a weak π-bond with the other Si atom of the dimer of which it comprises.

Exposure of this surface to atomic H can break the weak Si π-bonds, allowing H atoms to bond to the Si dangling bonds. Under controlled conditions a monolayer of H can be formed with one H atom bonded to each Si atom, satisfying the reactive dangling bonds, effectively passivating the surface; see FIG. 1A(a).

A STM tip or SEM is then used to selectively desorb H atoms from the passivated surface by the application of appropriate voltages and tunnelling currents, forming a pattern in the H resist; see FIG. 1A(b). In this way regions of bare, reactive Si atoms are exposed, allowing the subsequent adsorption of reactive species directly to the Si surface.

Phosphine ($PH_3$) gas is introduced into the vacuum system via a controlled leak valve connected to a specially designed phosphine micro-dosing system. The phosphine molecules bond strongly to the exposed Si(100)2×1 surface, through the holes in the hydrogen resist; see FIG. 1A(c).

Subsequent heating of the STM patterned surface for crystal growth causes the dissociation of the phosphine molecules and results in the incorporation of P into the first layer of Si; see FIG. 1A(d). It is therefore the exposure of an STM patterned H passivated surface to $PH_3$ that is used to produce the required P array. Note any alternate adsorption species can be used at this stage of the processing to produce conducting regions at the exposed silicon surface. These may be n or p-type dopants or any other molecule.

The hydrogen may then be desorbed, as shown in FIG. 1A(e), before overgrowing with silicon at room temperature, as shown in FIG. 1B(f). An alternative is to grow the silicon directly through the hydrogen layer, as shown in FIG. 1B(g).

The next step is to rapidly anneal the surface, shown in FIG. 1B(h).

Silicon is then grown on the surface at elevated temperature, shown in FIG. 1B(i). A barrier is then grown as shown in FIG. 1B(j). Finally conductive gates or ohmic contacts, or both, are aligned on the surface, as shown in FIG. 1B(k).

Thermal Hydrogen Desorption—FIG. 1A(e)

Assuming the steps described with reference to FIG. 1A(a) to (d) have been carried out, FIGS. 2 to 7 are all concerned with removing the hydrogen resist layer from the silicon surface before encapsulation with epitaxial silicon; that is the transition between the step of FIG. 1A(d) to 1A(e). Studies undertaken by us have confirmed that whilst it is possible to grow epitaxial silicon through the hydrogen resist, with complete electrical activation the quality of the silicon crystal grown is degraded as compared with removing the resist completely before growth[1]. To this end a series of experiments have been conducted to remove the resist layer. However we stress that devices can be made with or without removing the hydrogen resist.

In the first experiment a silicon (100) surface is terminated with atomic hydrogen to form a monohydride-terminated surface. This surface was then subjected to several different thermal anneals to determine the appropriate temperature required to remove the hydrogen resist layer effectively. Each surface shown in FIG. 2(a) to (d) was initially hydrogen terminated to a complete coverage of 1 ML.

FIG. 2(a) is a filled state STM image of hydrogen terminated surface following annealing to 500° C. for 10 seconds. The resulting surface is very rough as a result of the incomplete removal of the hydrogen resist. The many bright protrusions on this surface are silicon dangling bonds where hydrogen has been removed from these silicon dimers. The greater proportion of the surface is still terminated with hydrogen and appears darker. The significant amount of hydrogen remaining on the surface after this treatment makes this surface unfavourable for epitaxial silicon growth.

FIG. 2(b) shows a section of the hydrogen terminated surface following heating to a slightly higher temperature of 530° C. for 10 seconds. The nine bright 'zigzag' features are hemi-hydride or singly hydrogen occupied silicon dimers which still remain on the surface. The remaining dark features are dimer vacancies. The density of hydrogen on this surface is <0.1% and is low enough that epitaxial growth will not be affected on this surface.

FIG. 2(c) shows a section of the hydrogen terminated surface following an even higher anneal of 560° C. for 10 seconds. This surface exhibits 5 bright hemi-hydride features indicating that there is still some hydrogen on the surface. However there is a considerable increase in the dark features (dimer vacancies). These vacancies align together indicating significant rearrangement of the surface. This rearrangement is detrimental to the stability of lithographically placed dopant arrays such as those fabricated for the quantum computer. As a result we can conclude that this anneal temperature is too high.

The optimal anneal temperature seems to be ~530° C. when using a single anneal to desorb the hydrogen. In order to minimise the amount of thermal energy needed to remove the hydrogen we repeated this experiment in FIG. 2(d) but only annealing for 5 seconds rather than 10. This surface shows the same characteristics as the surface in FIG. 2(b) (i.e. a small number of hemi-hydride features and no aligned defects) indicating that the shorter heating time removes the hydrogen as effectively with a smaller thermal budget.

In order to determine the stability of lithographically placed dopant arrays to these heating conditions a monohydride surface was lithographically patterned with an STM tip.

The lithographically defined regions onto which the phosphine is deposited can be seen in FIG. 3(a). The structure is a castellation pattern in the upper part of the image and four ~5 nm points in the lower left of the image. The bright protrusions over the rest of the surface are silicon dangling bonds which have been inadvertently exposed by the STM lithography. This surface is then dosed with phosphine for three minutes at a pressure of $1\times10^{-9}$ mbar and heated to 350° C. for 10 seconds to incorporate the phosphorus into the surface silicon monolayer. The resulting surface is heated to 530° C. for 5 seconds to remove the hydrogen as in FIG. 2(b).

FIG. 3(b) shows the remnants of the dopant pattern after the 5 second 530° C. step. Some parts of the upper castellation pattern are seen but more importantly two of the point structures in the lower part of FIG. 3(a) have survived.

FIG. 3(c) shows a high resolution image of one of the points in FIG. 3(b) exhibiting most importantly a bright protrusion perpendicular to the dimer rows. This is characteristic of silicon ejected by the phosphorus incorporation process.

The identification of ejected silicon localised in regions defined by STM lithography, demonstrates that the phosphorus which has been incorporated at controlled locations remains in the same location after hydrogen is removed using thermal processing of 530° C. for 5 seconds.

Figure 4:
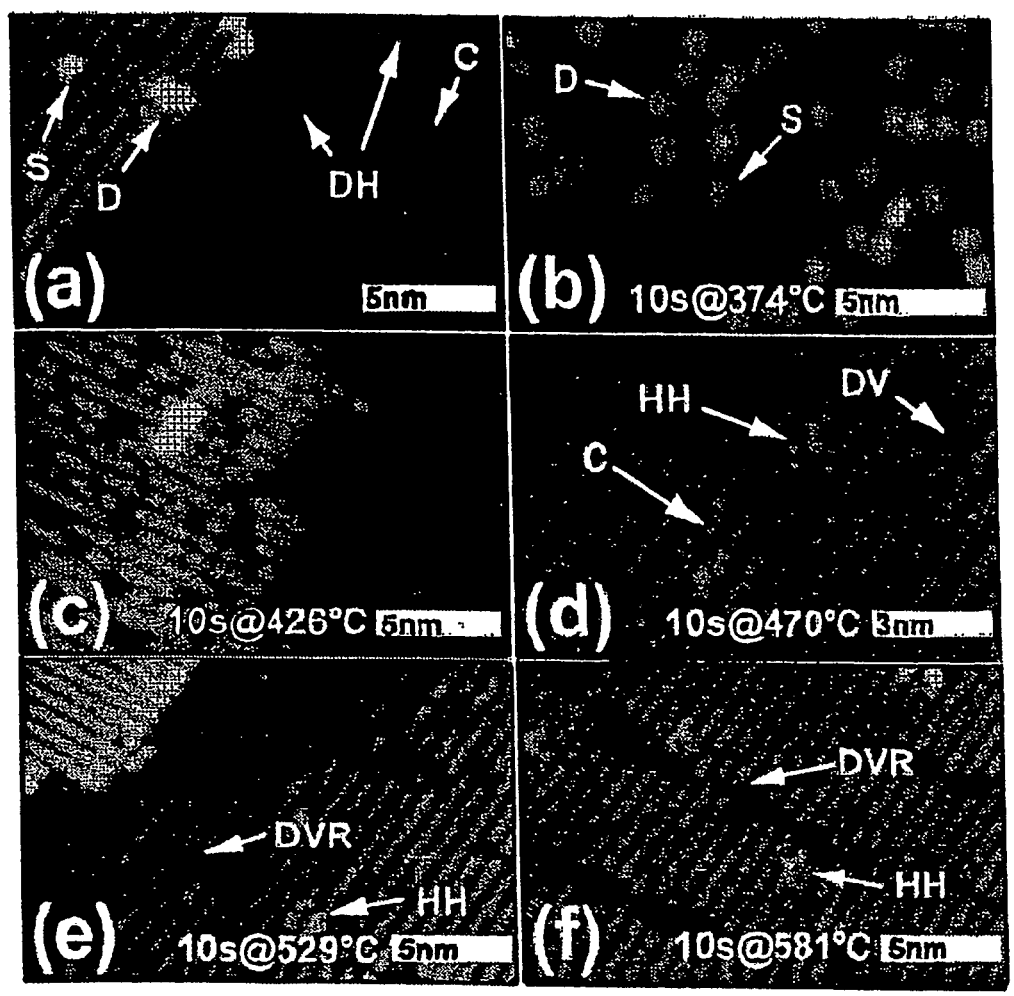
FIG. 4 is a series of filled state STM images showing a monohydride terminated Si(001) surface (a) and the surface after anneals at 374° C. (b), 426° C. (c), 470° C. (d), 529° C. (e), and 581° C. (f) for 10 s each. Imaging conditions were (a) −1.6V, 0.15 nA. (b) −1.2V, 0.15 nA. (c) −1.6V, 0.15 nA. (d) −1.2V, 0.14nA. (e) −1V, 0.15 nA. (f) −1V, 0.14 nA.
Figure 5:
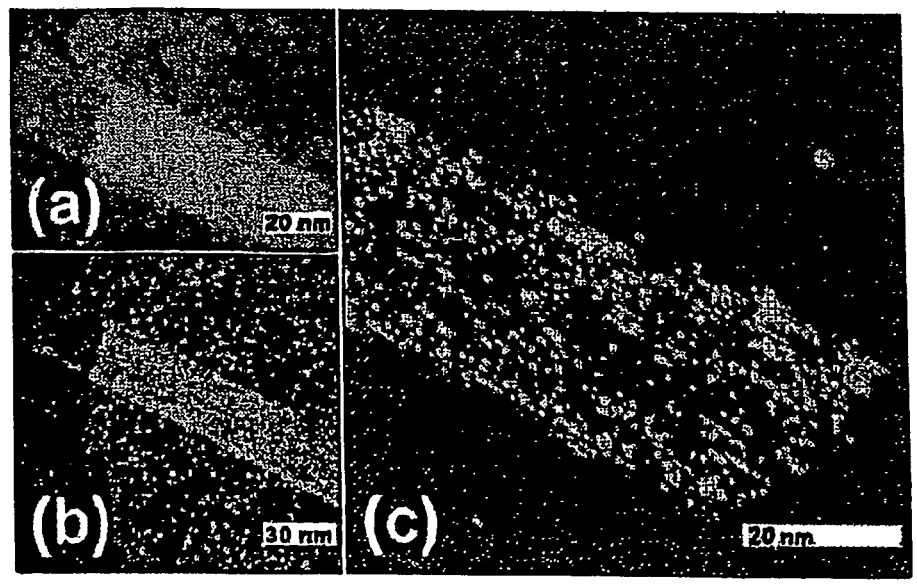
FIG. 5 is an STM image of a 200 nm×25 nm region of a monohydride terminated Si(001) surface from which hydrogen has been desorbed by biasing the STM tip to +4V at a current of 3 nA (a). After phosphine dosing and P incorporation at 350° C. (b), a 470° C. anneal removes all surface hydrogen, leaving the nanostructured region of phosphorus intact (c).

The results of a detailed high resolution STM study of the thermal desorption of hydrogen from the Si(001)2×1 surface using successive anneals are shown in FIG. 4.

All experiments were performed in an ultra-high vacuum system. Hydrogen was desorbed by passing a current directly through the sample and cooling to room temperature at a rate of ~2° C.s$^{-1}$. The substrate temperature was determined with an infrared pyrometer giving an accuracy of ±30° C.

FIGS. 4(a)-(f) shows high resolution STM images of a hydrogen terminated Si(001)2×1 surface (a) before and (b-f) after a succession of 10 s anneals at 374, 426, 470, 529 and 581° C. FIG. 4(a) shows an STM image of a nearly perfect Si(001):H terminated surface where each silicon atom of a dimer bonds to one hydrogen atom, resulting in 1 ML hydrogen coverage. The bright protrusions in the top left of the image, are single and double dangling bonds (labelled S and D respectively) that result from an incomplete termination of the surface on the upper terrace. Also visible on the surface are a C-type defect (labelled C) and two double-dihydride dimers (labelled DH) in which two hydrogen atoms bond to each Si dimer atom. A monohydride terminated surface with such a low density of dangling bonds provides an ideal resist layer for STM lithography experiments.

FIG. 4(b) shows the H terminated surface after a 10 s anneal to 374° C. during which the density of both single and double dangling bonds has increased. Whilst some single dangling bonds have rearranged to form dangling bond pairs during this anneal the limited hydrogen mobility at this temperature, combined with the short anneal time has meant that not all single dangling bonds have paired up. Hence, both single and double dangling bonds still appear on the surface.

FIG. 4(c) shows the same surface after a further 10 s anneal at 426° C. Here the surface is dominated by bare silicon, rather than monohydride, and as a result, the monohydride terminated Si dimers appear dark against the brighter non-terminated Si(001). This change in the surface appearance adds a complication to the interpretation of the STM images since dimer vacancies (DVs) also appear as darkened dimer-sized patches in filled state STM images, similar to the monohydride terminated dimers. We estimate the defect density from interpolating the DV density observed in filled state imaging before (FIG. 4(b)) and after (FIG. 4(d)), the 426° C. anneal. From this comparison we can determine that there was no significant increase in DV density during the annealing process and that the hydrogen coverage in FIG. 4(c) is approximately 25%.

FIG. 4(d) shows the same surface after a further 10 s anneal at 470° C. A few final H atoms of the resist layer still remain on the surface but now in the form of hemihydrides (where a single isolated H atom bonds to one atom of a Si dimer). At this coverage the probability for one hemihydride (labelled HH) to desorb as $H_2$ by finding another hemihydride as it diffuses across the surface becomes diminishingly small. We can conclude that at this anneal temperature the resist layer has been effectively removed since the presence of such small coverages of H are not expected to significantly degrade subsequent epitaxial Si overgrowth. We also note the presence of a few C-type defects and DV defects. Whilst the number of C-type defects has remained unchanged the density of DV defects is slightly higher than for the initial clean surface. There may be two reasons for this increase. Firstly, Si etching can occur during annealing if there are dihydrides on the surface. However, the density of dihydrides seen in FIG. 4(a) is very low and the amount of etching that would be expected to occur would therefore be small. Secondly, dimer vacancies are known to be generated during annealing of a Si surface. This means that any further annealing will also serve to further increase the DV defect density as seen in FIGS. 4(e) and (f).

FIG. 4(e) shows the surface after a further anneal to 529° C. for 10 s. Here the number of hemi-hydrides has been further reduced whilst the number of C-defects remains approximately the same as in FIG. 4(d). However, as expected the density of dimer vacancies has increased significantly as a result of the continued annealing. At these temperatures many of the DV defects have rearranged from a random distribution to align perpendicular to the dimer rows. This DV alignment occurs only after the hydrogen has been desorbed implying that hydrogen inhibits the migration of dimer vacancies on the surface in the same way that it inhibits silicon dimer migration. The formation of aligned DV defects called dimer vacancy rows (DVR) is energetically favorable at temperatures above ~500° C., at which DVs become mobile. The density of DVRs increases after another anneal at 581° C. for 10 s shown in FIG. 4(f). Subsequent annealing at even higher temperatures (not shown) leads to more pronounced DVRs but no significant morphological changes.

Having studied the desorption of a H resist layer from a Si(001) surface in detail using successive anneals we find that there is a temperature range of 470±30° C. within which the H resist can be removed effectively from the surface with minimal defect generation. The optimal anneal temperature is slightly lower compared to the previous study shown in FIG. 2 where single shot anneals were used to desorb the hydrogen. This is due to the fact that during successive anneals hydrogen is partially desorbed even below the hydrogen desorption temperature thus decreasing the temperature necessary to completely remove the hydrogen. We now address the important question whether a phosphorus doped nanostructure patterned into the H resist layer survives intact during a thermal anneal to remove the resist.

FIG. 5(a) shows a hydrogen terminated surface where a 200×25 nm$^2$ patch of hydrogen has been removed using the STM tip. The H resist appears darker because of the higher density of surface states associated with unterminated surface. A low density of single and double dangling bonds is observed around the lithographic region arising from an incomplete hydrogen termination. The surface is then exposed to 0.135 L of $PH_3$ gas which is adsorbed only in the patch region. Subsequent annealing to 350° C. for ~1 s causes the phosphine to dissociate and the phosphorus to incorporate into the nanostructured region of the surface.

The region of incorporated phosphorus atoms can be seen in FIG. 5(b). This STM image shows a slight increase in dangling bond density on the hydrogen terminated surface after the 350° C. anneal due to a small amount of hydrogen desorption.

Figure 17:
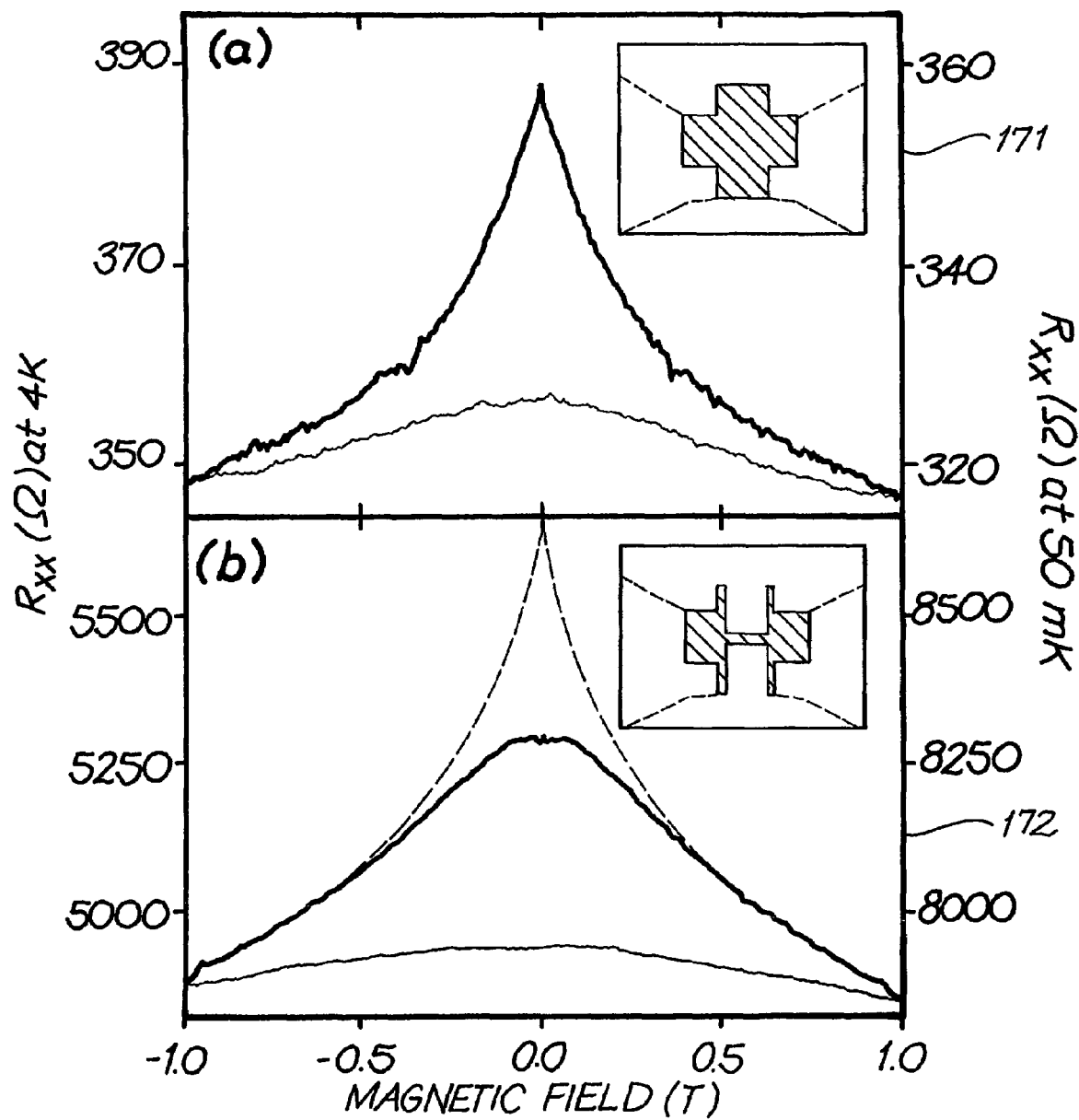
FIG. 17(a) is a graph of the magnetoresistance of a 4×4 μm$^2$ square device at different temperatures and a wire.
FIGS. 17(b), (c) and (d) are graphs of the magnetoresistance of different wires. The dashed lines show the magnetoresistance predicted by 2D weak localisation theory. Insets show schematics of the device and wire geometries.
Figure 17:
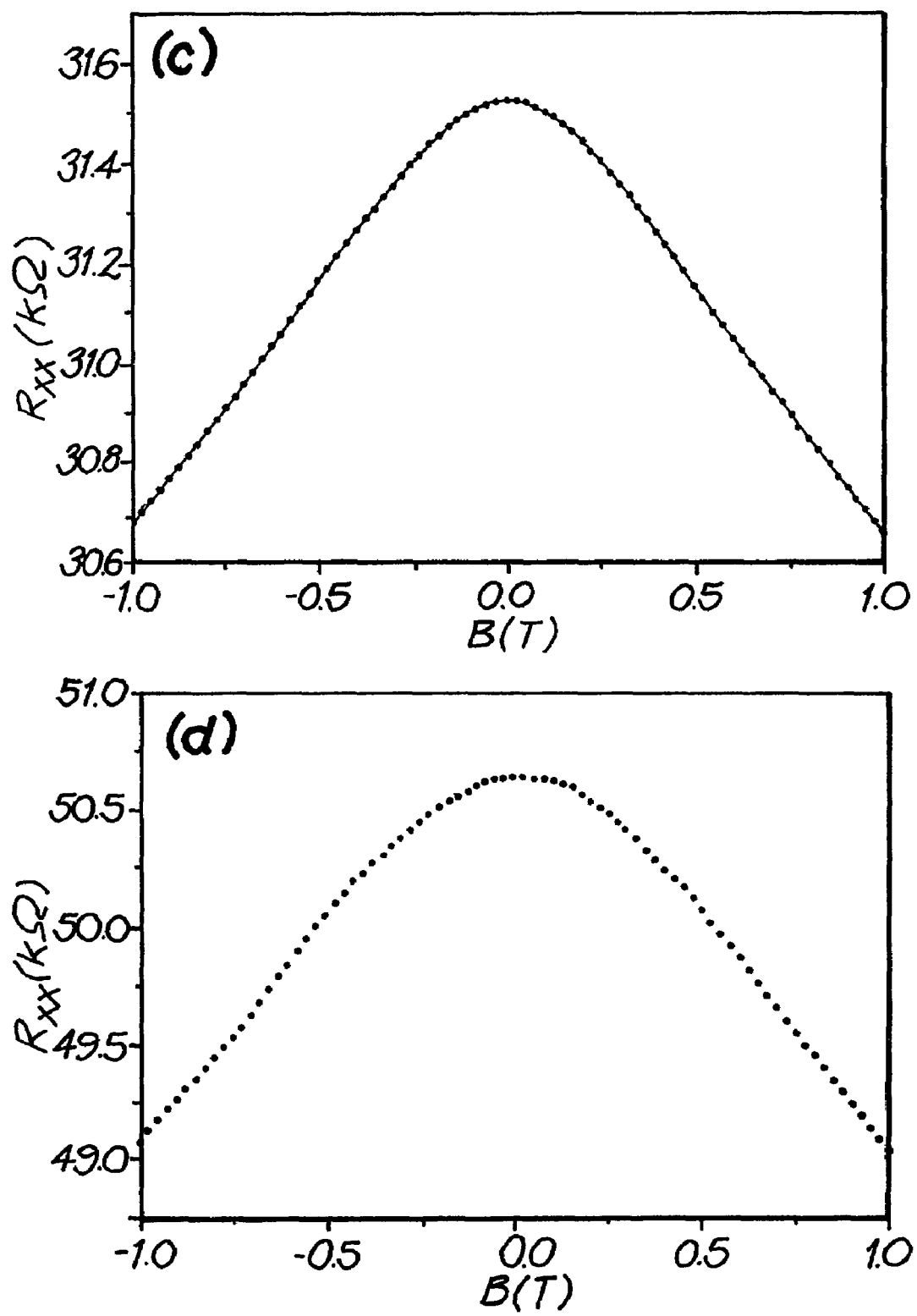

An anneal to 470° C. for 10 s is now applied to remove the hydrogen resist from the doped nanostructure. FIG. 5(c) shows that almost all of the hydrogen has been removed from the surface with some DV defect generation. Importantly, the boundary between the phosphorus doped region and the surrounding silicon surface is sharp as indicated by the presence of bright elongated features in the phosphorus doped region. These features are chains of silicon atoms ejected during the P incorporation process. The sharp boundary arises since the ejected silicon is mobile during the anneal and diffuses to the edge of the lithographic region. Further diffusion of the silicon atoms appears to be inhibited by the hydrogen resist as it desorbs. It can be seen that silicon accumulates at the boundary of the phosphorus doped region nucleating small silicon islands. A closer inspection of individual features in the STM images of the nanostructure reveals that, within our detection accuracy, no phosphorus has diffused out of the nanostructured region. The fact that a 470° C. anneal does not result in diffusion has also been independently confirmed by electrical measurements from an STM patterned nanostructure device in which a 10 s, 470° C. hydrogen desorption anneal was used for a P doped nanostructure of width 90 nm (see FIG. 17). The surface in FIG. 5(c) also shows an increased defect density with significant DV ordering close to the P doped region. Such ordered defects are not seen away from the nanostructured region. We attribute the formation of DVRs to the relief of surface strain caused by the localized high phosphorus density in the nanostructure. The surface in FIG. 5(c) shows almost complete removal of the H resist while the phosphorus dopant structure remains in place. This surface provides an ideal starting point for epitaxial Si growth to encapsulate the phosphorus doped nanostructure.

STM Tip Induced Hydrogen Desorption

Using the STM tip for hydrogen removal for the lithography process can also be applied to completely removing the resist after phosphine dosing and incorporation.

Figure 6:
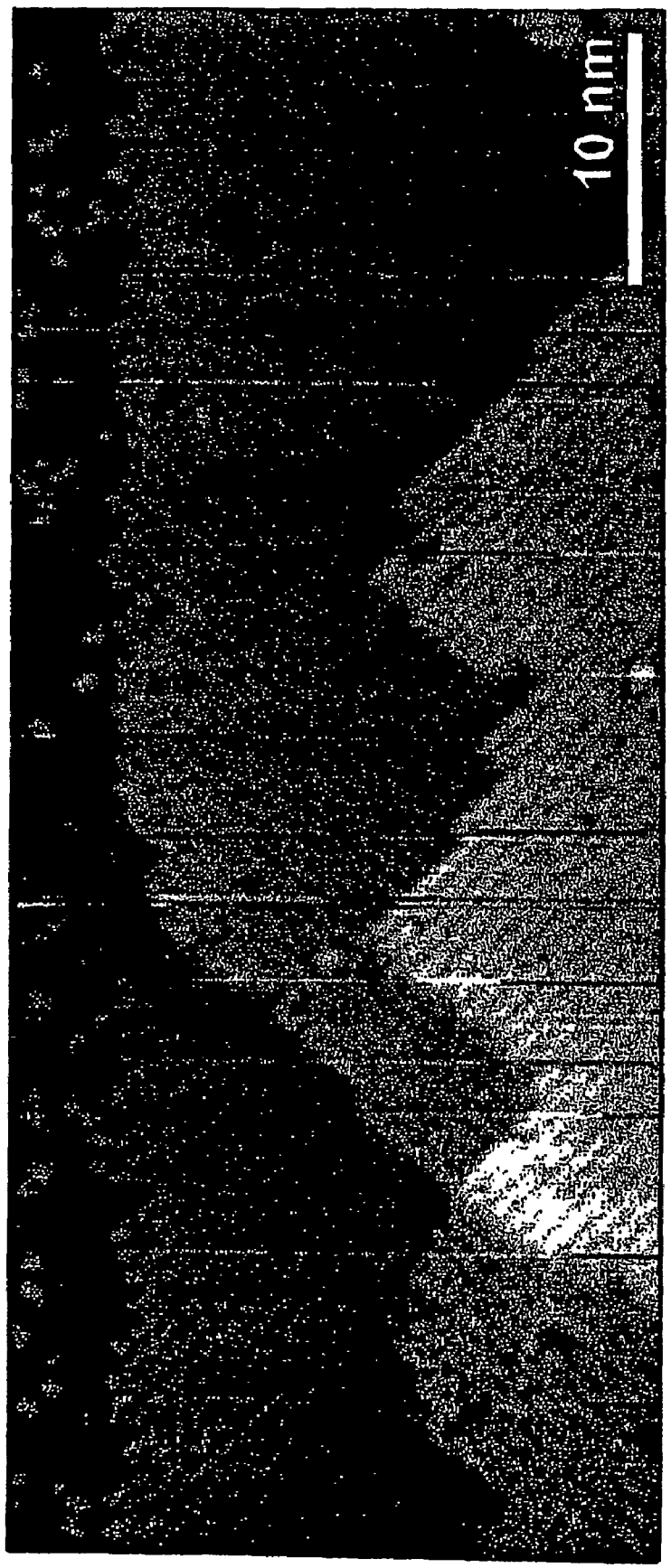
FIG. 6 is an STM image showing a hydrogen terminated surface after desorption with an STM tip.

FIG. 6 shows a 1 ML monohydride terminated surface was subjected to repeated passes in a raster pattern of the STM tip under conditions of +4V sample bias, 3 nA constant current to almost completely desorb hydrogen from the surface. The top of FIG. 6 shows a portion of the surface which is still hydrogen terminated. This region has many random dangling bonds due to the high bias and current used to desorb the patch. The exposed silicon surface shows a small amount of remnant hydrogen in the form of monohydride and hemi-hydride dimers but is otherwise undamaged by the desorption process. This means that hydrogen can be removed in large areas using the STM tip leaving behind a suitable surface for subsequent epitaxial silicon growth.

Figure 7:
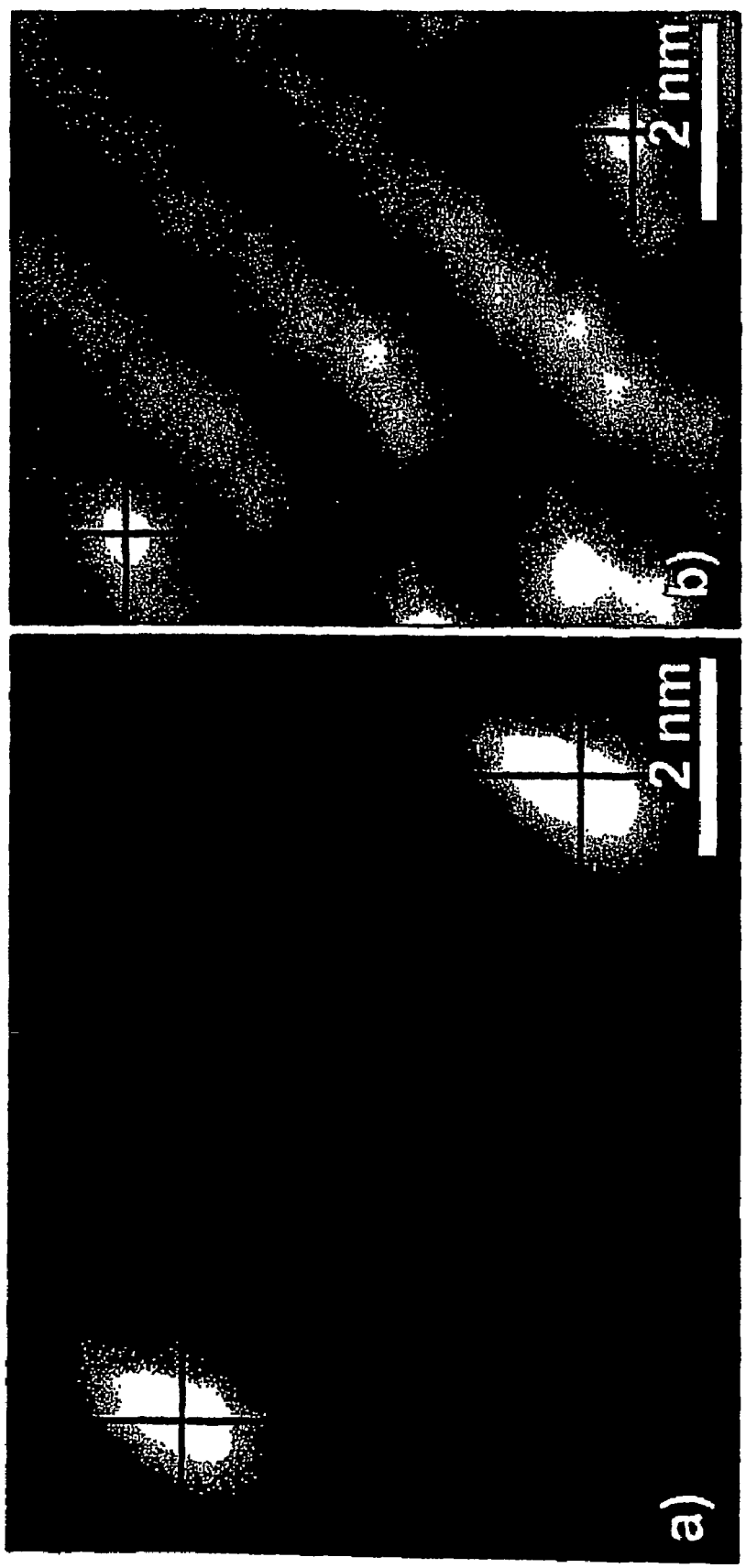
FIGS. 7(a) and (b) are STM images showing two dangling bonds exposed in the hydrogen terminated surface using STM lithography (a), and the same surface after phosphine dose, annealing and removal of the hydrogen resist with an STM tip (b).

To demonstrate the effectiveness of this technique for removing the hydrogen whilst maintaining the integrity of the lithographically incorporated phosphorus atoms we highlight the experiment performed in FIG. 7.

FIG. 7(a) shows two bright features on a hydrogen terminated silicon surface corresponding to two dangling bonds that have been exposed by STM lithography. The surface is then phosphine dosed and annealed to incorporate P atoms into the top layer of the silicon surface before an STM tip is them used to remove the hydrogen resist completely.

FIG. 7(b) shows the same surface after the hydrogen has been almost completely removed from this region of the surface using the STM tip with +4V, 3 nA tunnelling conditions. The two bright protrusions are clearly observed at the surface corresponding to the two incorporated phosphorus atoms, which are seen to be in the same locations as the dangling bonds prior to phosphorus dosing in FIG. 7(a).

Other dark features in the image are thought to be hemi-hydride features resulting from incomplete desorption of hydrogen. This result clearly demonstrates that the hydrogen resist can be almost completely removed from the surface using the STM tip whilst maintaining the integrity of the carefully created STM patterned array of P atoms in silicon.

Encapsulation of Incorporated P by High Purity Silicon

FIGS. 8 to 12 are all concerned with the silicon encapsulation process, and in particular the best way to achieve an atomically smooth layer so that we can image the buried Si-P heterodimers and ensure that they do not move out of their arrays.

Growing Silicon Over Doped Surfaces—FIGS. 1B(f) and (g)

There are two approaches to the growth of silicon with no P present. Encapsulation at room temperature and elevated temperatures. And, encapsulation at room temperature and subsequent annealing.

FIG. 8(a)-(h) show filled state STM images taken at RT of two separate growth experiments.

In the first experiment FIG. 8(a) shows small 2D islands and short Si dimer chains at the surface after 5 ML growth at 255° C. Subsequent annealing of the surface at temperatures of 345 (b), 498 (c), and 600° C. (d) causes the Si surface to flatten due to island coarsening and diffusion of Si atoms to step edges. The bright asymmetric features that occur result from segregated P atoms, forming Si-P heterodimers and the density of these can be seen to increase during successive anneals.

In the second experiment, after 5 ML growth at RT 3D Si islands are formed due to the small mobility of Si atoms on the surface, see FIG. 8(e). FIGS. 8(f)-(h) show that successive annealing steps flatten the surface as with the 5 ML growth at 255° C.

Interestingly, the Si surface morphology in the different experiments looks very similar for the same annealing temperature, even for the first annealing step at ~350° C. for 5 s (b), (f). However, FIGS. 8(b)-(h) clearly show that the density of Si-P heterodimers at the Si surface is much lower for a given anneal temperature if the Si encapsulation occurs at RT compared with 255° C. Si growth.

FIG. 8(e) highlights an important limitation in the use of STM to investigate P segregation/diffusion: the high surface roughness that results from low temperature growth makes identification of Si-P heterodimers at the surface difficult. To identify a Si-P heterodimer a sufficient brightness contrast between the heterodimer and the surrounding Si surface is necessary, which can only be obtained for atomically flat surfaces. Therefore, Si-P heterodimers only become clearly visible in our experiments after a short anneal at ~350° C. for 5 s. As a consequence the P density at the Si surface after the first anneal is a result of not only P segregation that occurs during growth but also arises from diffusion of P atoms that occurs during the subsequent anneal. Nonetheless it is reasonable to assume that P diffusion, with an energy barrier of 3.66 eV, is negligible for short anneals at such low temperatures. The P density observed at the surface after the first anneal therefore is most likely a result of P segregation that occurs during Si growth.

Figure 8:
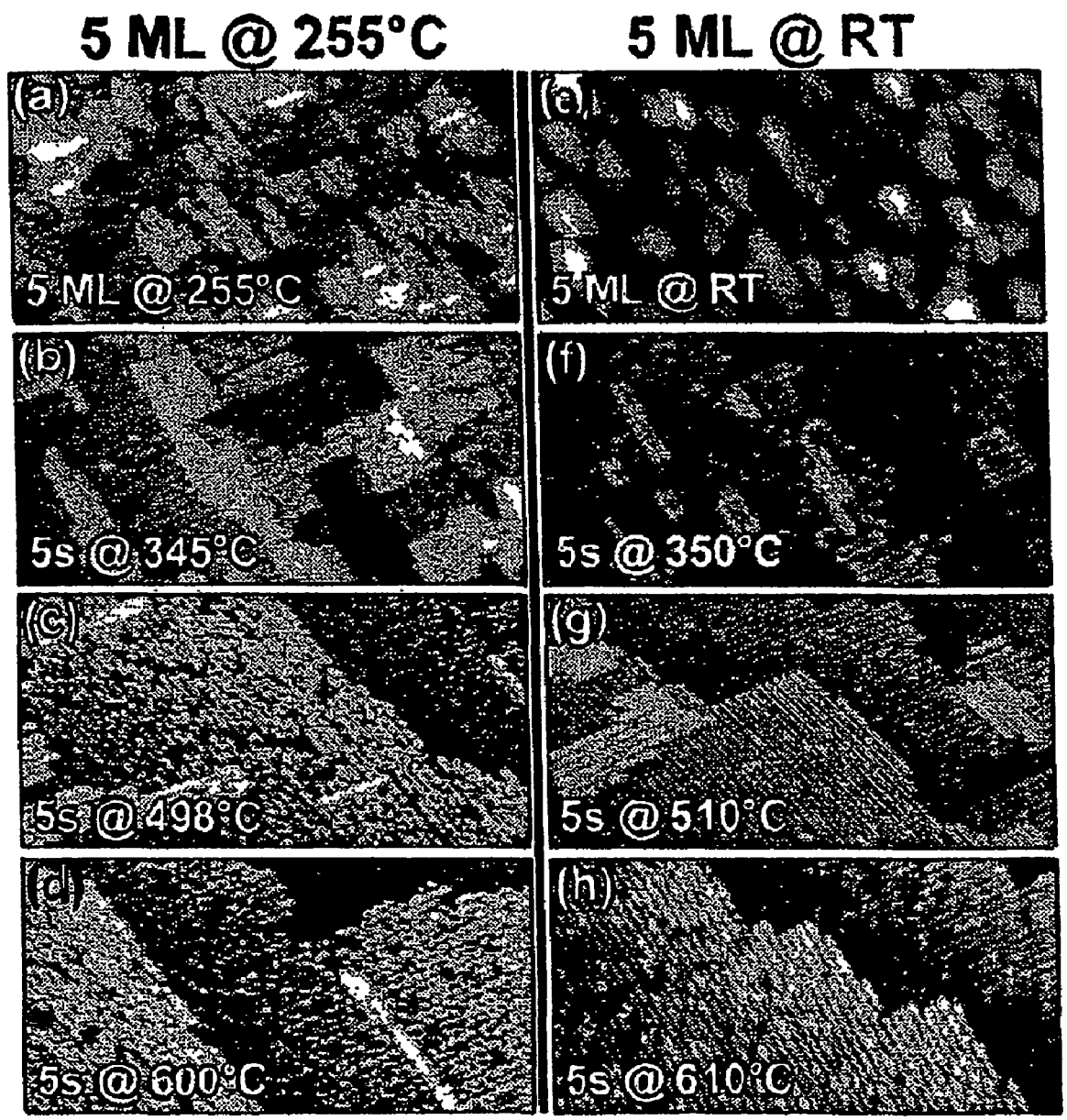
FIG. 8 is a series of filled state STM images showing the Si(001) surface after Si overgrowth (a), (e) and annealing at various temperatures (b)-(d) and (f)-(h) from two experiments: 5 ML Si growth at 255° C. (left column) and RT (right column). The image size of individual STM images is 50×25 nm$^2$.
Figure 9:
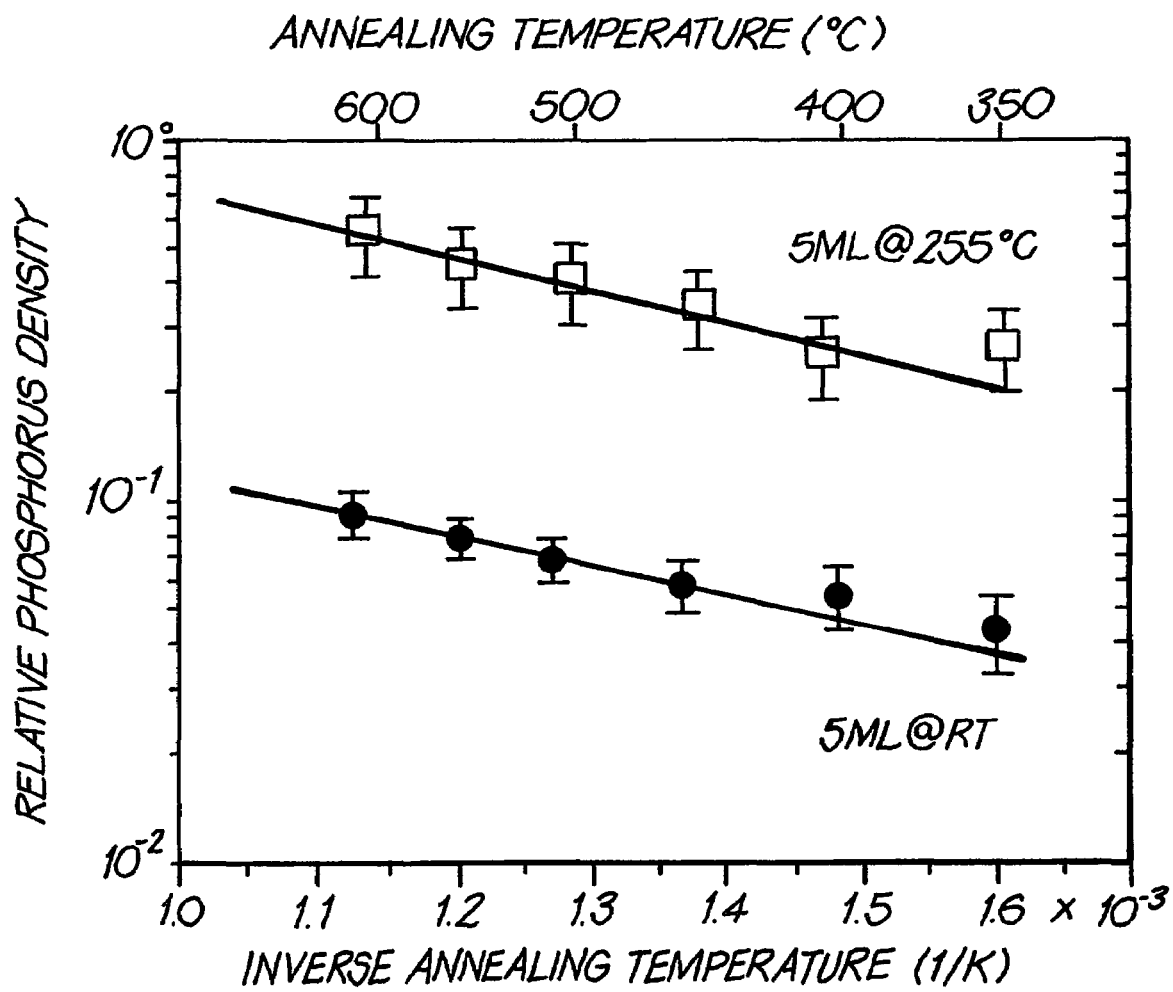
FIG. 9 is a graph showing the relative density of P atoms at the Si(001) surface after 5 ML Si encapsulation at RT and 255° C., respectively, and various annealing steps. The density relative to the initial coverage was determined from STM images. The lines are to guide the eye.

To quantify the density of P atoms at the Si(001) surface observed in the STM images of FIG. 8 we have counted the number of Si-P heterodimers after each anneal. FIG. 9 shows the increase in the density of P atoms at the surface following subsequent annealing steps for the two different experiments. The relative density is obtained by comparison of the P density after Si growth and sample annealing, with the initial density of incorporated P atoms after PH₃ dosing and 600° C. annealing of the clean Si surface.

If we consider the first 5 s annealing step at 350° C. for the P atoms encapsulated in Si grown at 255° C. already ~25% of the P atoms have segregated to occupy surface lattice sites. After subsequent annealing at 400, 450, 500, 550, to 600° C. nearly 60% of the P atoms are present at the surface. These results demonstrate that even with a short, low temperature anneal encapsulation of P atoms in epitaxial Si, grown at ~250° C., results in significant P segregation.

In contrast, if P atoms are overgrown with 5 ML of Si deposited at RT and annealed at 350° C. for 5 s, only ~5% of the initial number of P atoms are present at the surface. During subsequent annealing at 400, 450, 500, 550, and 600° C. the P density only increases slightly to ~10% due to diffusion of P atoms from subsurface layers to the surface. The reduced density of P atoms at the Si surface compared to the 255° C. Si growth experiment is a direct consequence of the strongly suppressed segregation of P atoms during Si overgrowth at RT.

To calculate the segregation length $\Delta$ of P in Si at 250° C. and RT from the STM data we use the relation[54]

$$p_{inc} = a_0/4\Delta$$

where $P_{inc}$ is the incorporation probability and $a_0/4 = 0.1358$ nm, the distance between two subsequent Si(001) monolayers. We know that in FIG. 9 we find about 25% of P atoms at the surface after 5 ML Si growth at 255° C. and the first anneal at ~350° C. This means that 75% of the P atoms were incorporated. From this value (assuming that only segregation during growth occurred and that the diffusion of P atoms during the first annealing step at ~350° C. is negligible) we get an incorporation probability $p_{inc} = 0.24$. According to the relation above this value corresponds to a segregation length of $\Delta = 0.58$ nm. For 5 ML Si growth at RT, the same analysis gives a segregation length of $\Delta = 0.29$ nm.

Phosphorus Delta Doping

Figure 10A:
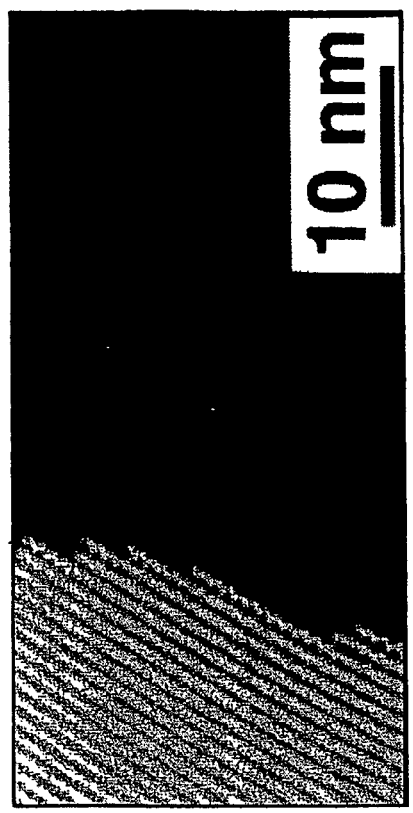
FIG. 10(a) to (d) are a series of diagrams and STM images showing the process of saturating a silicon surface with phosphine, then annealing and encapsulating it by Si growth to fabricate a phosphorus δ-doped layer in silicon.
Figure 10A:
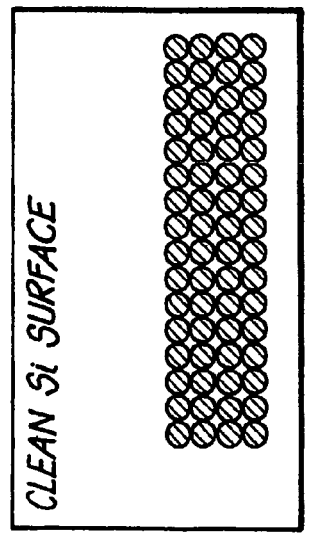
Figure 10B:
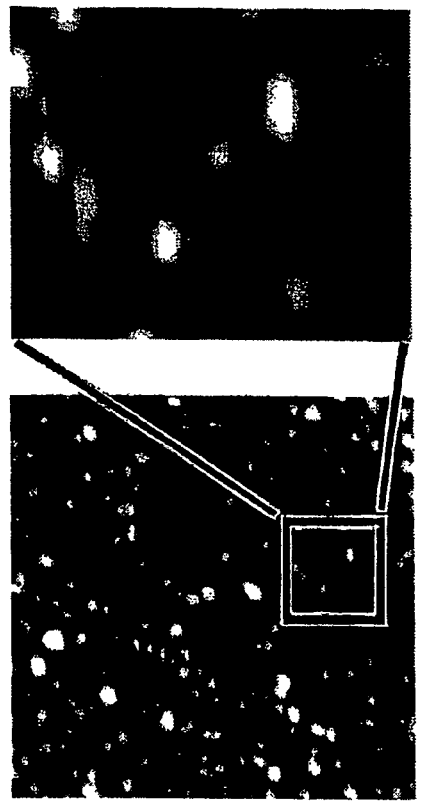
Figure 10B:
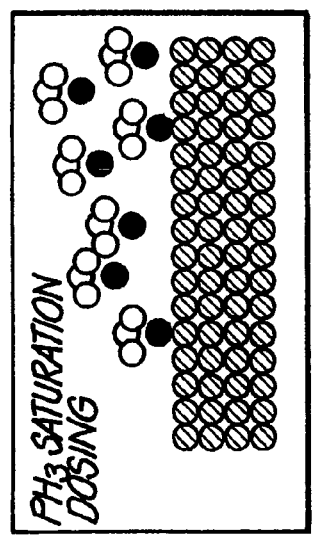
Figure 10C:
Figure 10C:
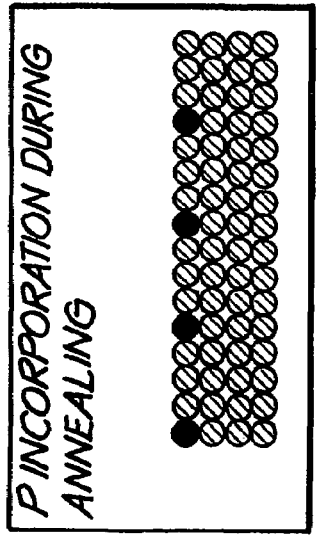
Figure 10D:
Figure 10D:
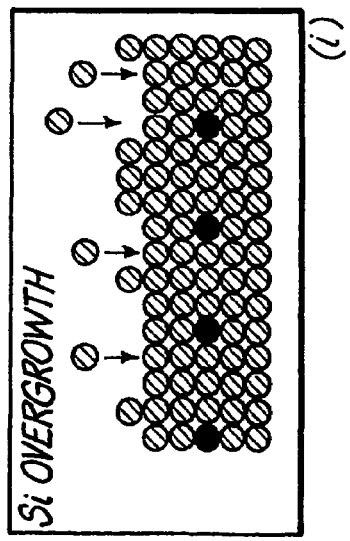
Figure 11A:
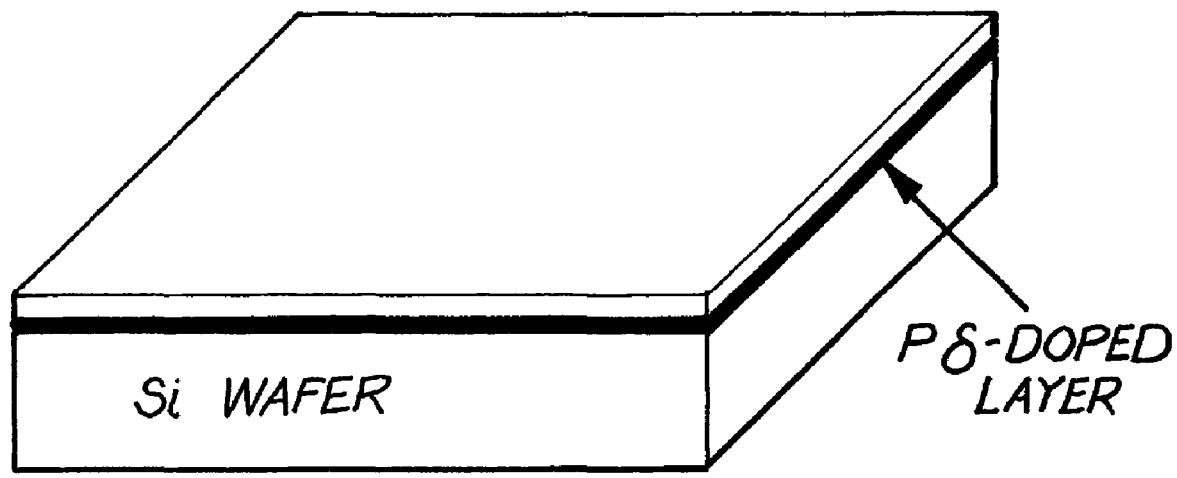
FIG. 11(a) is a schematic diagram of a phosphorus δ-doped silicon sample; (b) is an optical microscope photograph which shows the Hall bar structure used for Hall effect measurements; (c) shows the results of the Hall effect measurements.

In order to determine the electrical activation of the phosphorus atoms epitaxially overgrown by silicon, a phosphorus delta doped layer was grown and made into a Hall bar device structure; see FIG. 11(a). The fabrication steps for such a device are outlined in FIG. 10.

FIG. 10(a)(i) is a schematic and FIG. 10(a)(ii) is an STM image which shows a clean (100)2×1 silicon surface.

FIG. 10(b)(i) is a schematic and FIG. 10(b)(ii) is an STM image and enlargement which shows the surface after phosphine saturation dosing at room temperature.

FIG. 10(c)(i) is a schematic and FIG. 10(c)(ii) is an STM image which shows the surface after annealing at 550° C. to incorporate the phosphorus atoms into the surface as P-Si dimers.

FIG. 10(d)(i) is a schematic and FIG. 10(d)(ii) is an STM image which shows the surface after growing 24 nm of epitaxial silicon at 250° C. (the silicon surface after growth at room temperature is not shown here).

Figure 11B:
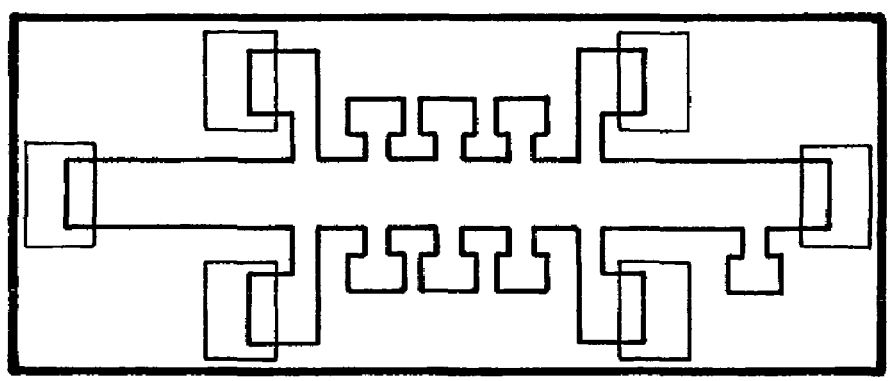
FIG. 11(d) shows the normalized magnetoresistance; and (e) the magneto-conductivities (measurement data and fit curves) as a function of normalized magnetic field of Si:P δ-doped layers for samples encapsulated at RT, 250 and 400° C.
Figure 11C:
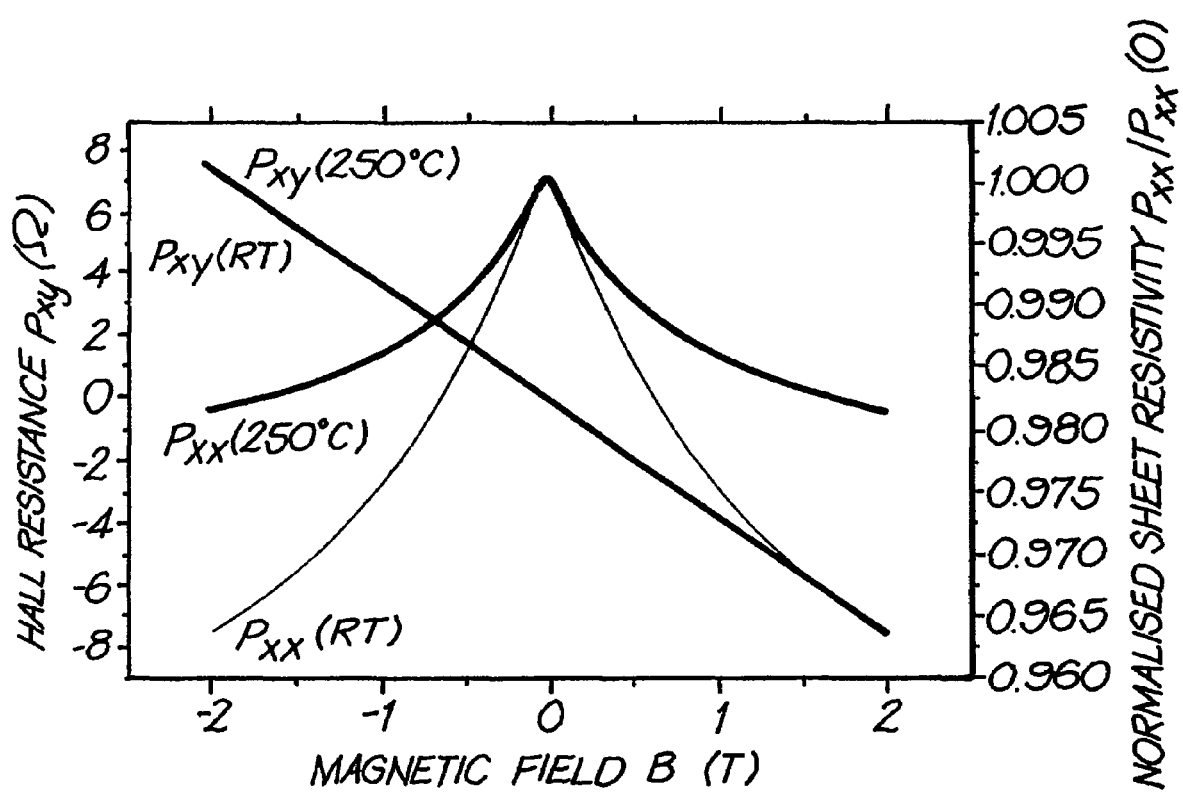

FIG. 11(a) is a schematic and FIG. 11(b) is an optical microscope photo of the resulting Hall bar device after formation of ohmic contacts. FIG. 11(c) shows the normalised sheet resistivity, $p_{xx}/p_{xx}(0)$ as a function of magnetic field, B at a sample temperature of 4 K for samples grown at either 250° C. or room temperature. The resulting data shows peaks at B=0, characteristic of weak localisation of electrons. Removing the weak localisation correction, and calculating the Hall slope (from FIG. 11(c)) allows us to estimate the mobility of the 2D layer as 70 cm²V⁻¹s⁻¹ for the sample grown at 250° C. and 30 cm²V⁻¹s⁻¹ for the sample grown at room temperature. FIG. 11(c) also shows the Hall resistivity for these phosphorus delta doped samples giving a carrier density of $1.7 \times 10^{14}$ cm⁻² for both samples. This density is in excellent agreement with the 2D dopant density demonstrating that all of the phosphorus dopants that are incorporated into the silicon crystal are electrically active within the measurement error for both samples. This is a significant result for the fabrication of electronic device structures since it demonstrates that the phosphorus atoms incorporated using this process will be electrically active at these high doping densities.

Figure 11D:
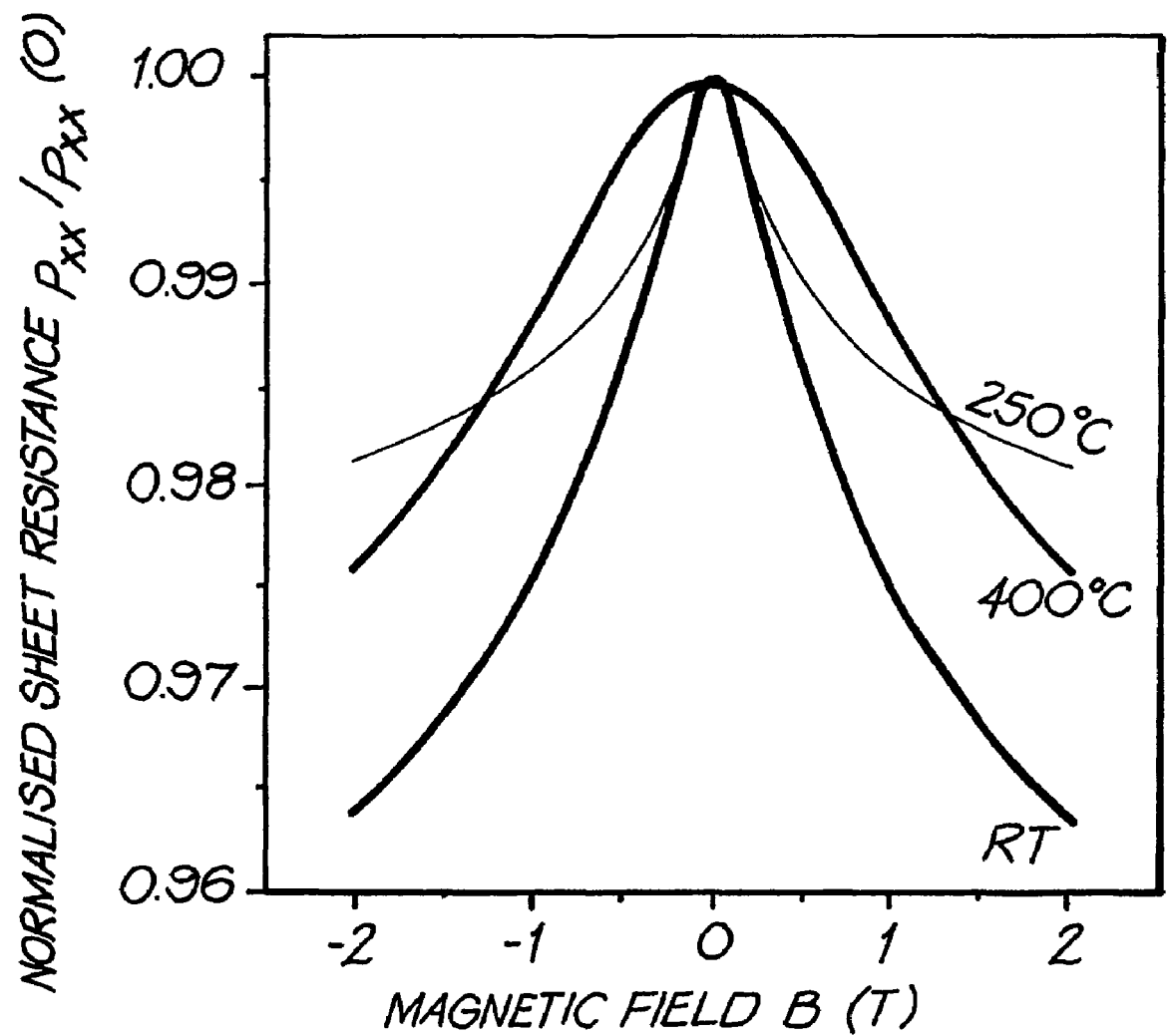
Figure 11E:
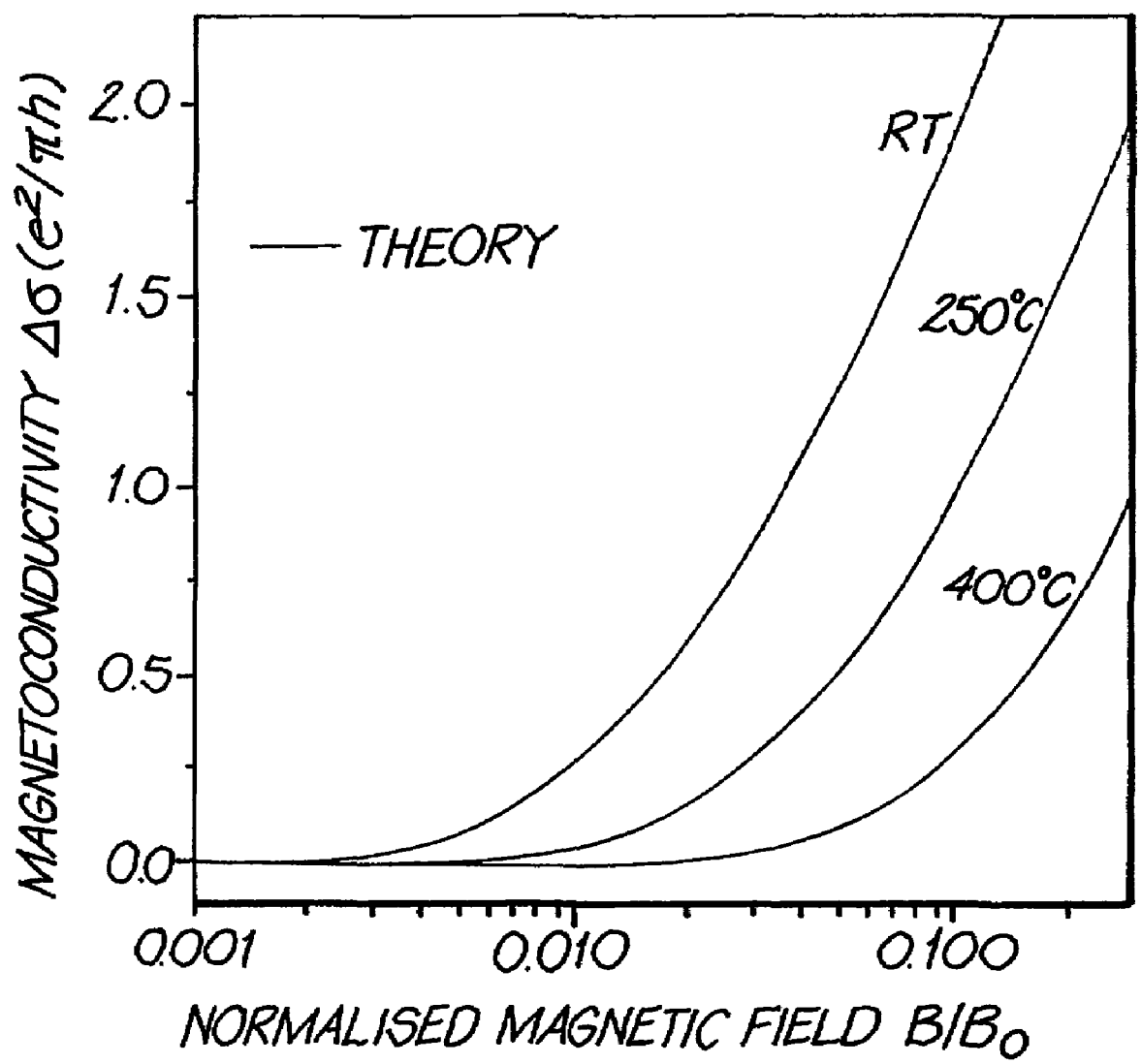

FIG. 11(d) shows the magnetoresistance (MR) of P-in-Si δ-doped samples grown at RT, 250 and 400 C. The negative MR behaviour is a clear signature of weak localization (WL) which arises from coherent backscattering of electrons in time-reversed trajectories. From the shape of the MR curve, we can extract the phase relaxation time $\tau_\phi$ and phase coherence length $l_\phi$ which are measures of the characteristic scales for which quantum interference effects become observable. In order to do this, we fitted the WL correction to the conductivity $\sigma$ using the Hikami model[38] for a disordered 2D-system of non-interacting electrons:

$$\Delta\sigma_{wl} = -\frac{\alpha e^2}{\pi h}\left[\Psi\left(\frac{1}{2} + \frac{B_o^L}{B}\right) - \Psi\left(\frac{1}{2} + \frac{B_\phi}{B}\right)\right] \quad (1)$$

where $\alpha$ is a scaling factor, $\Psi$ is the digamma function and $B_o$ and $B_\phi$ are the characteristic magnetic fields associated with elastic transport and phase relaxation rates respectively. The fitting range was limited to B<0.1$B_o$. In FIG. 11(e), we plot the magneto-conductivity $\Delta\sigma = \sigma_{xx}(B) - \sigma_{xx}(0)$ of the δ-doped layer as a function of normalized magnetic field B/$B_o$ and compare it to the theoretical predictions from the Hikami model. The values of the fitting parameters $\alpha$, $B_o$, $B_\phi$ and the corresponding $\tau_\phi$ and $l_\phi$ extracted from data fitting are listed in Table 1.

TABLE 1

Results from SIMS, 4.2 K magnetoresistance measurements and data fitting for samples encapsulated at various temperatures T.

| | T(° C.) | | | |
|---|---|---|---|---|
| | RT | 250 | 400 | 600 |
| $l_{seg}$ (nm) | 1.5 | 2.3 | 100[a] | 1000[a] |
| $n_{31}$ (10¹⁴ cm⁻²) | 1.3 | 1.4 | 1.7[b] | 0.4[b] |
| $n_s$ (10¹⁴ cm⁻²) | 1.67 | 1.64 | 0.22 | — |
| $\rho_{xx}(0)$ (kΩ □⁻¹) | 1.66 | 0.63 | 3.32 | — |
| μ(cm² V⁻¹ s⁻¹) | ~23 | ~61 | ~86 | — |
| τ(fs) | ~4 | ~10 | ~15 | — |
| l(nm) | ~3 | ~9 | ~5 | — |
| α | 1.1 | 1.2 | 1.5 | — |
| $B_o$ (T) | 22.1 | 3.7 | 10.2 | — |
| $B_\phi$ (T) | 0.062 | 0.031 | 0.36 | — |
| $\tau_\phi$ (ps) | 1.6 | 1.3 | 0.5 | — |
| $l_\phi$ (nm) | 52 | 72 | 21 | — |

[a]Extrapolation of literature data.
[b]Includes contributions from both ³¹P and ³⁰SiH.

An important parameter for quantum devices is $l_\phi$. It increases from 52 nm for the RT sample to 72 nm for the 250 C sample and then decreases to 21 nm for the 400 C sample. As $l_\phi \propto \sqrt{\tau n_s \tau_{100}}$, the increase in $l_\phi$ from the RT to the 250 C sample is mainly due to the corresponding increase in τ since these two samples have similar $n_s$ and $\tau_\phi$. The smaller value of $l_\phi$ for the 400 C sample is due to the smaller values of $\tau_\phi$ and $n_s$ which offset the higher value of $\tau$. In addition, the significant spread of dopants within the ~25 nm Si epilayer of the 400 C sample implies that the thickness of the P-doped layer is of the same order as $l_\phi$ and the sample is thus on the border of the 2D limit.[39] The above analysis gives a measure of $l_\phi$ and $\tau_\phi$, and shows that the 250 C encapsulation is most suitable for making devices that show quantum coherent effects.

Figure 12:
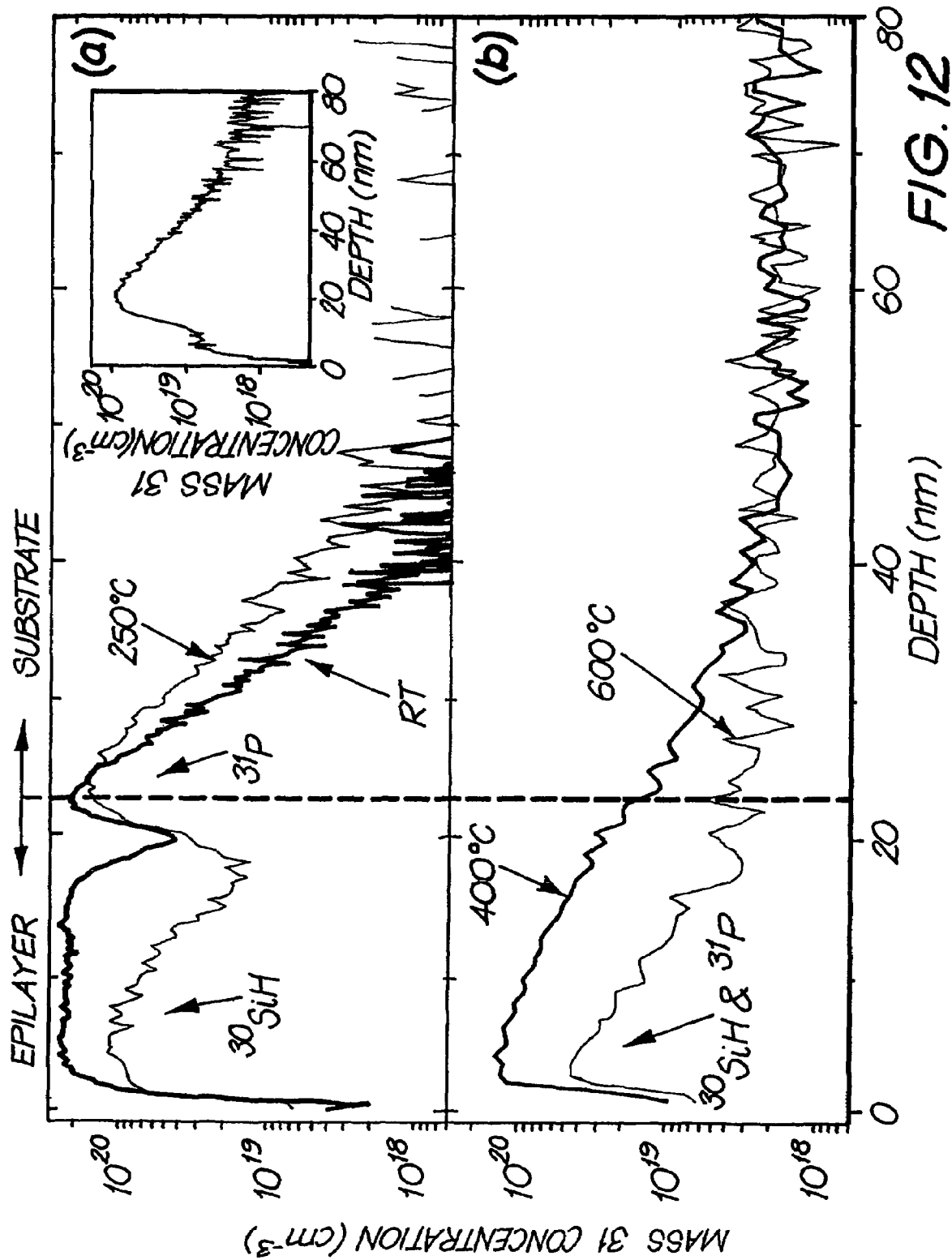
FIG. 12 is a graph showing the mass-31 to depth profiles of δ-doped samples grown at RT, 250, 400 and 600° C., respectively, determined by SIMS using a 5.5 keV Cs$^+$ primary ion energy in an ATOMIKA system. The inset shows the high mass resolution CAMECA SIMS measurement.

In order to determine the extent of the confinement of the P atoms within the δ-doped layer we have performed secondary ion mass spectrometry (SIMS) measurements on our δ-doped samples. FIG. 12 shows the mass 31 depth profiles for phosphorus δ-doped samples encapsulated at RT, 250, 400 and 600° C. determined by SIMS. Both the RT and 250° C. samples show two separate mass 31 peaks: a broad peak near the surface and a sharper peak at the interface between the substrate and epitaxial layer. The higher mass resolution SIMS measurement (inset of FIG. 12), however, shows only one $^{31}$P peak at the interface between substrate and epitaxial layer demonstrating that the peak near the surface is due to $^{30}$SiH. The full width at half maximum of the $^{31}$P peak is 4 nm for the RT sample and 6 nm for the 250 C sample. From SIMS measurements, we determined the P segregation length to be 1.5 nm for RT and 2.3 nm for 250° C. overgrowth thus showing the smaller degree of segregation during RT encapsulation. For the 400 and 600° C. samples, we see only one broad mass 31 peak near the surface. We attribute this to the strong segregation of P atoms to the surface at these high growth temperatures. The corresponding segregation lengths extracted from extrapolating literature data[20] are 100 nm for 400° C. growth and 1000 nm for 600° C. growth. From the SIMS measurements, we determine the $^{31}$P concentration $n_{31}$ by integrating the area under the $^{31}$P peak of the samples encapsulated at RT and 250° C., respectively. Within the SIMS measurement error of ~20%, the $^{31}$P concentrations for the RT and 250° C. samples are in agreement with the expected value of $1.7 \times 10^{14}$ cm$^{-2}$ (see Table 1). However, this analysis is not possible for the higher temperature encapsulation because the single mass 31 peak is so broad that it now includes contributions from both $^{30}$SiH and $^{31}$P. For the 400° C., this gives a higher value of $n_{31}$ than for RT and 250° C. For the 600° C. sample, $n_{31}$ is significantly lower indicating the strong segregation of $^{31}$P to the surface where it is not detected by SIMS and possibly the onset of P desorption from the surface.

Registration of Atomic and Nanoscale Devices and Atomic and Nano-Scale Device Fabrication We will now describe more work for which we have used a new STM-MBE system which has a combined SEM and STM, for imaging registration markers with the SEM and or optical microscope and then bringing the very delicate STM tip down at a precise location with respect to the markers. A laser interferometer stage allows precise movement of the STM over millimeter distances with nanometer resolution to position and relocate patterned devices with respect to the registration markers. Extreme anti-vibration measures have been taken to decouple the atomic resolution STM chamber from the resonating MBE growth chamber and its associated pumps since both technologies are needed to fabricate the complete device.

The system is capable of dealing with 1 cm$^2$ samples (~5× larger than normal STM samples) using a special e-beam heater to prepare the atomically flat (100) silicon surface. These large sample sizes are more compatible with standard cleanroom processing.

FIGS. 13 to 18 are all concerned with the fabrication and electrical measurement of atomic and nano-scale devices using registration markers on the silicon surface to register the atomic and nano-scale device to metallic surface gates and contacts needed for electrical measurements. The fabrication of registration markers which are visible in optical or scanning electron microscopes is a basic requirement for connecting atomic-scale devices to the outside world. The registration markers have to survive all processing steps such as sample heating and silicon growth.

Figure 13:
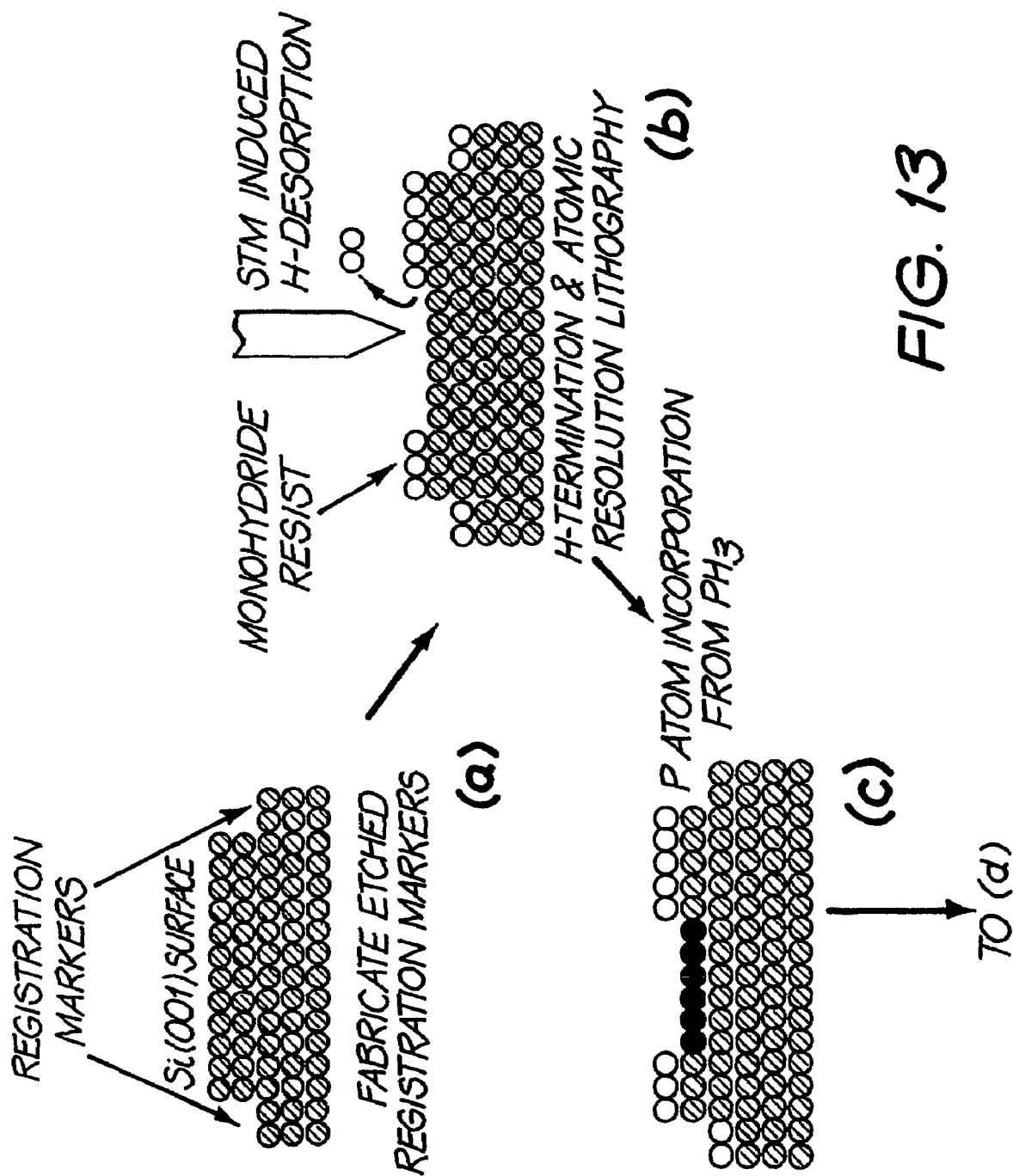
FIG. 13(a) to (f) is a schematic diagram illustrating the main steps to the fabrication of atomic and nanoscalescale devices.
Figure 13:
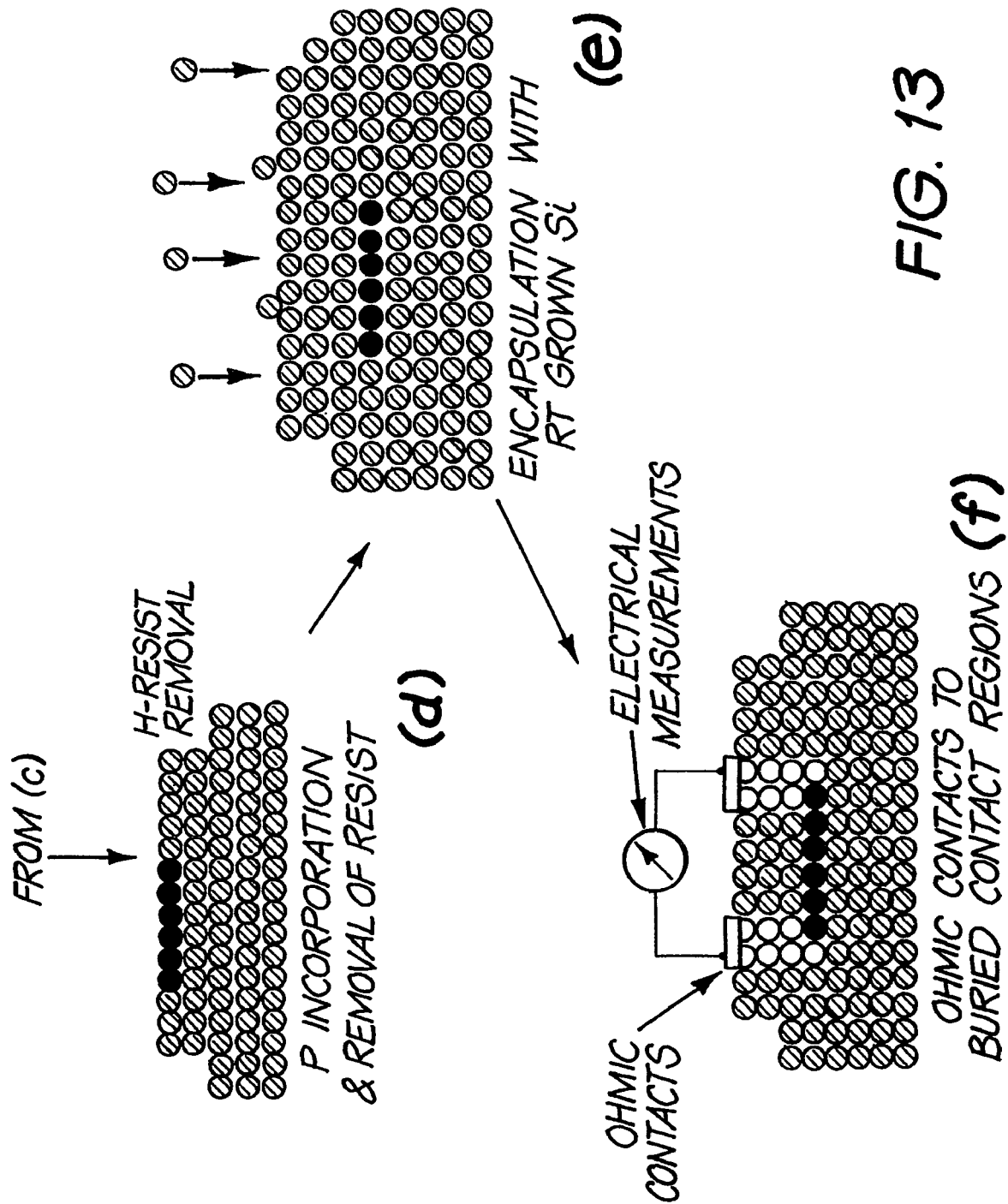

FIG. 13 is a schematic diagram illustrating the atomic and nano-scale device fabrication process developed to be compatible with the markers. The device fabrication process starts, FIG. 13(*a*) with the fabrication of registration markers which are needed to identify the exact location of the atomic or nano-scale device for the formation of ohmic metal contacts and surface gate electrodes at the final stage of the device process. These registration markers can have various sizes between a few nm and several μm to be identified directly by scanning over the markers with the STM or in scanning electron microscope (SEM) images or optical microscope images. Registration markers can be fabricated using focused ion beam (FIB) milling or etching of the silicon surface. The silicon surface can be etched using either wet-chemical etching or reactive ion etching (RIE) of lithographically structured areas which are defined by optical or e-beam lithography (EBL) to leave the active silicon area protected by a layer of oxide.

Before the sample is loaded into the vacuum system it is cleaned ensure an atomically flat, contaminant-free silicon surface needed for STM imaging. The silicon dioxide is removed using a buffered hydrofluoric acid bath. Organic contaminants and optical resist residues are removed using sulphuric peroxide. Carbon surface concentration is reduced by hydrofluoric acid. Metal contaminants are removed by RCA-2. Nitrogen blow-drying finalises the wet-chemical cleaning process.

Figure 14:
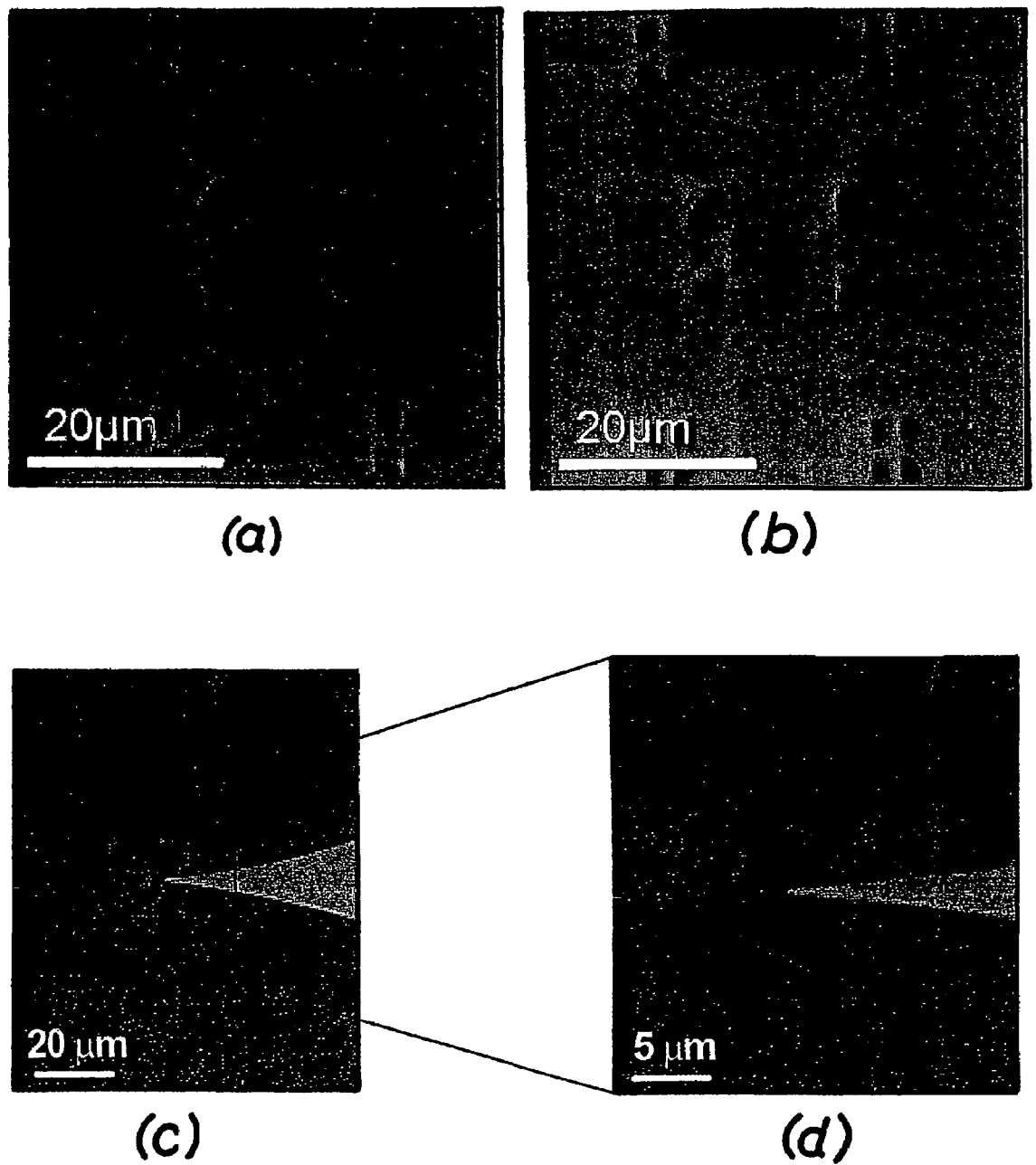
FIG. 14(a) to (d) is a series of SEM images showing a set of registration markers etched into the Si(001) surface at various stages of processing.

The sample is then introduced into the UHV chamber, and FIG. 14(*a*) shows the registration markers after introduction into the chamber but before any further processing takes place. The sample is further cleaned in the UHV environment by heating the backside using electron beam heating, and a final annealing is performed by heating to a temperature above 1050° C. The end result is the formation of the Si(100) 2×1 surface which is then terminated with a monolayer of hydrogen atoms.

A set of differently sized registration markers can be used (see FIG. 14) to more accurately define the position of atomic-scale devices and to make sure that the markers survive all subsequent processing steps such as sample heating and Si epitaxial growth.

Using the SEM the STM tip is then brought to the sample surface close to the registration markers, see FIGS. 14(*c*) and (*d*). Atomic or nano-scale lithography is then used to define the desired device structure. Dopant incorporation such as phosphine dosing and phosphorus incorporation steps are then carried out, see FIG. 13(*c*). Removal of the hydrogen resist layer is carried out, see FIG. 13(*d*). Encapsulation of the incorporated P atoms with epitaxially grown silicon is carried out, see FIG. 13(*e*). Finally, using the registration markers and optical lithography or EBL a metal layer is deposited on parts of the silicon surface to form ohmic metallic contacts or gate electrodes which are needed for electrical measurements to the buried atomic-scale device, see FIG. 13(*f*).

FIG. 14(*b*) is a SEM image of the registration markers after all device fabrication in UHV including the encapsulation of 25 nm of epitaxial silicon.

Figure 15A:
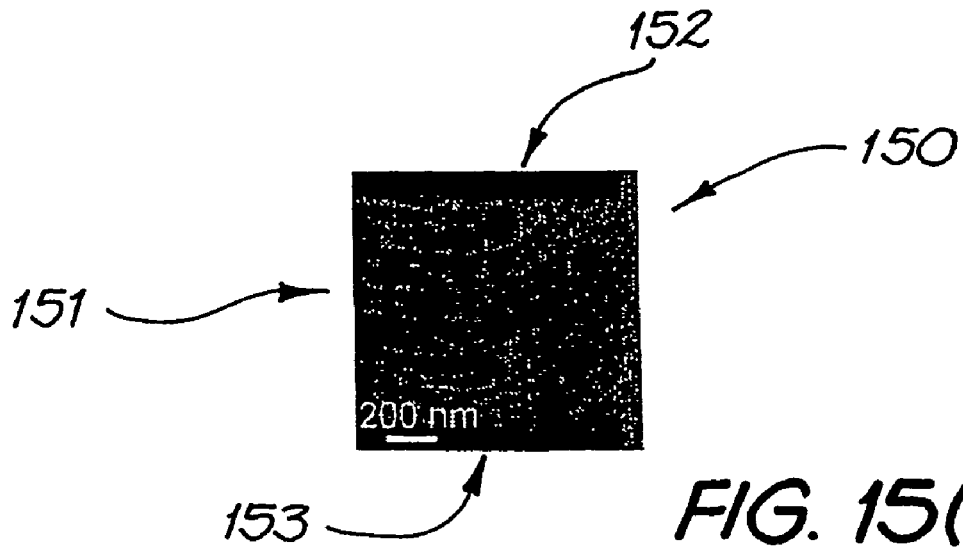
FIG. 15(a) is an STM image and FIG. 15(b) is a schematic diagram, and FIGS. 15(c) and (d) are optical microscope images, all of which illustrate the fabrication process of a 4×4 μm$^2$ phosphorus doped 2D device.
Figure 15B:
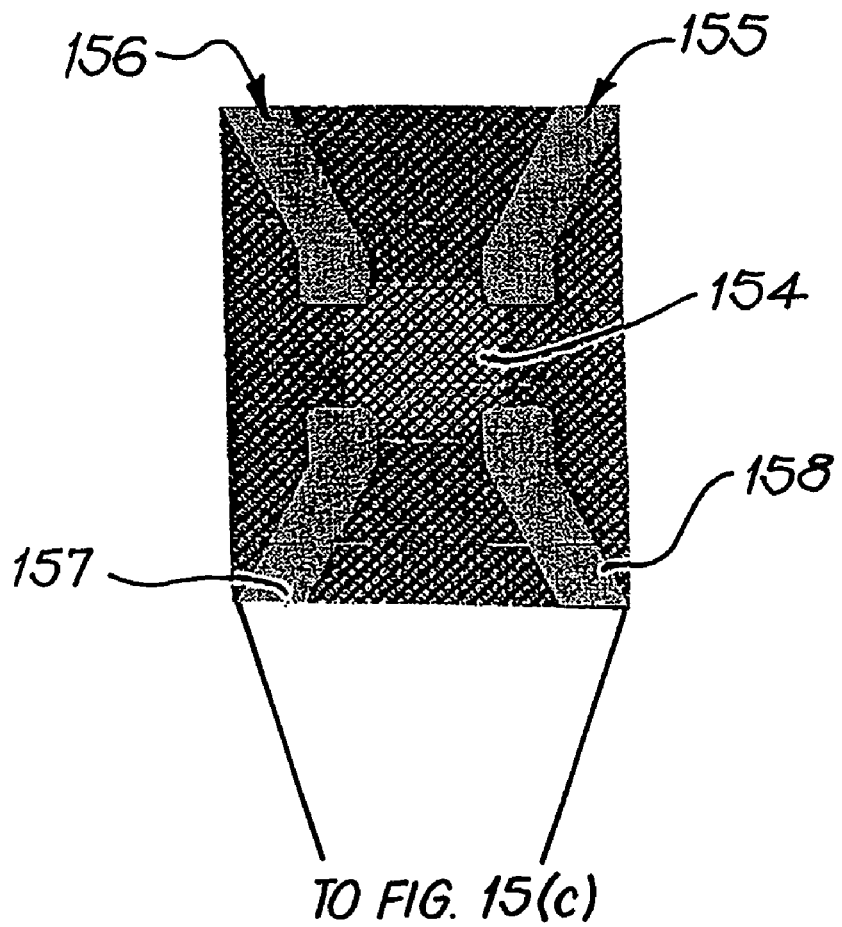
Figure 15C:
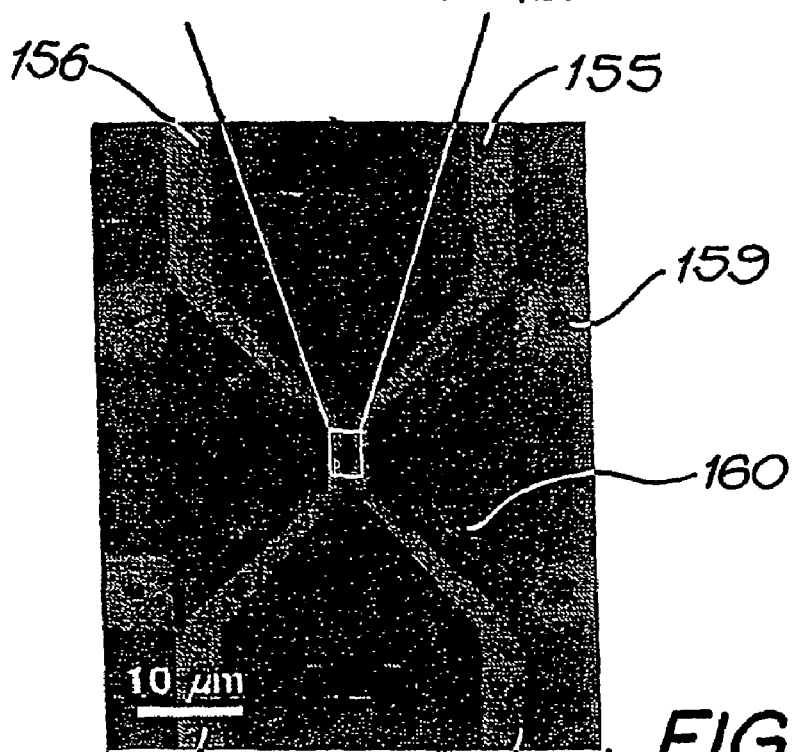
Figure 15D:
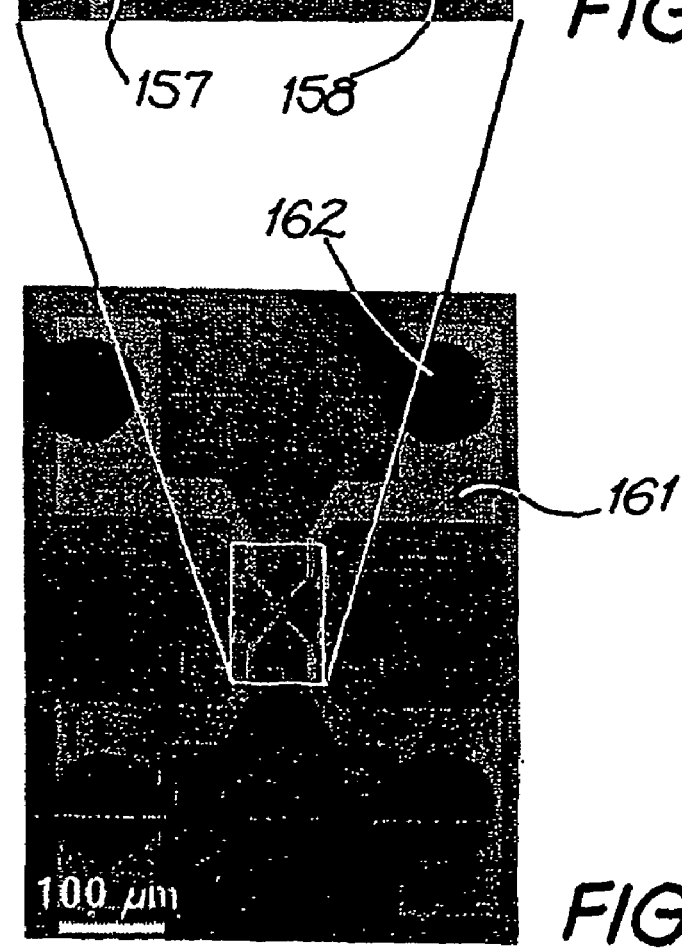

FIG. 15(*a*) to (*d*) illustrate the fabrication process of a buried 4×4 μm$^2$ phosphorus doped 2D device 150. FIG. 15(*a*)

is an STM image showing a bright area 151 from which hydrogen was desorbed using the STM tip and two dark areas at the top 152 and bottom 153 of the image where hydrogen still remains on the surface. FIG. 15(b) is a schematic which shows a P doped device area, bright square 154, and four metal finger contacts 155, 156, 157 and 158. FIG. 15(c) shows an optical microscope image of the device region after complete fabrication of the device. The metal finger contacts and registration markers, such as 159 and 160 are clearly visible, whereas the nanostructure buried in the center under 25 nm of epitaxial silicon is not visible. FIG. 15(d) shows a larger scale optical microscope image of the device region including large metal contact areas, such as 161, used for bonding of thin metal wires, such as 162, to the device which are needed for electrical measurements.

Figure 16A:
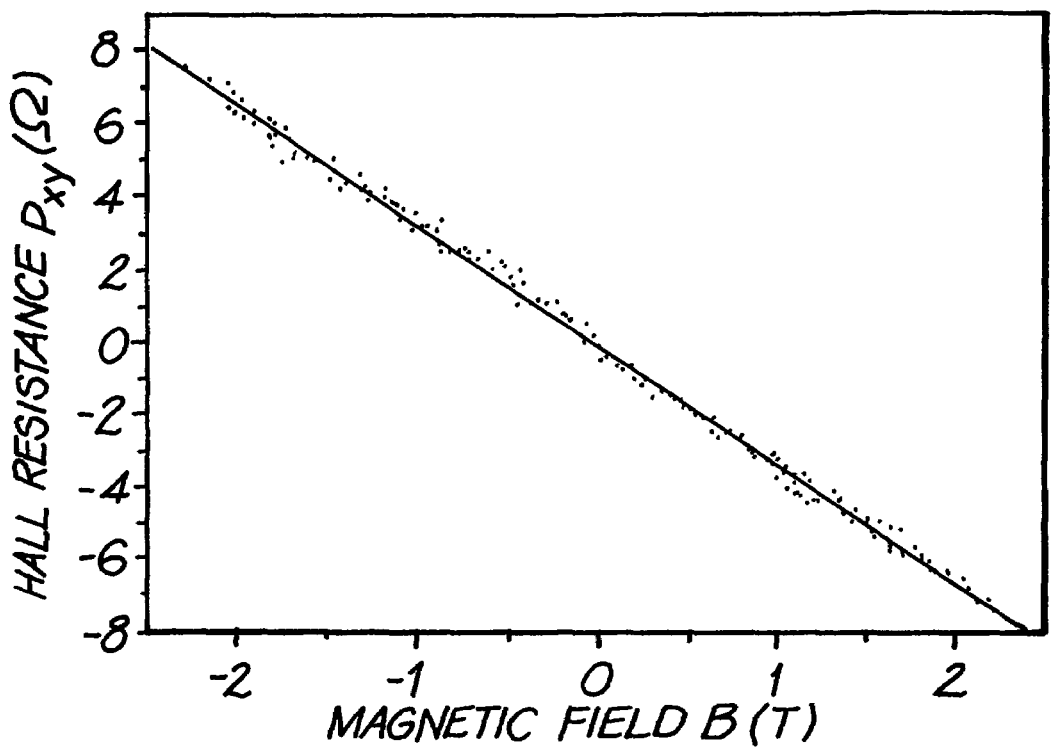
FIG. 16(a) is a graph which shows the Hall resistance versus the magnetic field of a 4×4 μm$^2$ phosphorus doped 2D device encapsulated with approx. 25 nm of epitaxially grown silicon measured at 4 K sample temperature.
Figure 16B:
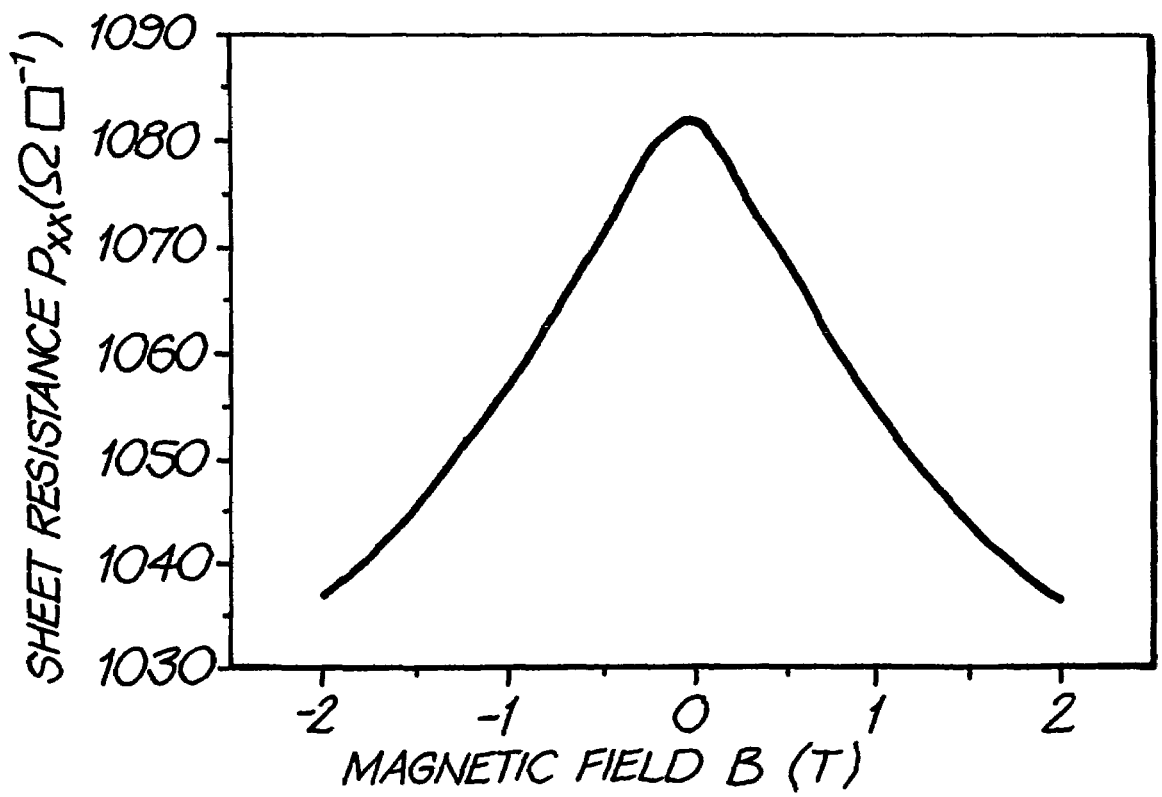
FIG. 16(b) is a graph which shows the sheet resistance versus the magnetic field of this sample.

FIG. 16(a) is an STM image of a hydrogen terminated Si(001) surface, dark area 163 from which hydrogen was removed to form an approx. 100 nm wide and 1 μm long wire with two contact regions on both ends, the bright "H"-shaped area 164. FIG. 16(b) is a schematic which shows a wire with two contact regions on both ends contacted by metal fingers, such as 165.

FIG. 16(a) shows the Hall resistance versus the magnetic field of a 4×4 μm² phosphorus doped 2D device encapsulated with 25 nm of epitaxially grown silicon measured at 4 K sample temperature. The Hall slope corresponds to an electron density of $1.79 \times 10^{14}$ cm$^{-2}$ in excellent agreement with the expected value of $1.7 \times 10^{14}$ cm$^{-2}$ from the phosphine dosing/phosphorus incorporation process (see also FIGS. 11(c) and 12). This demonstrates full electrical activation of the encapsulated phosphorus dopant atoms. FIG. 16(b) shows the sheet resistance versus the magnetic field of this sample. The peak of the sheet resistance at zero magnetic field is due to weak localisation of the electrons which demonstrates the 2D structure of the device.

Four terminal magnetoresistance measurements of two STM-patterned devices (4×4 μm² patch and 90×900 nm² wire) were performed at 0.05-4 K to confirm the suitability of the fabrication strategy for the creation of nano-scale devices. In particular we aimed to determine the influence of the STM-patterned device geometry on electron transport in the presence of a magnetic field.

FIG. 17(a) shows the magnetoresistance of the 4×4 μm² phosphorus δ-doped square device both at 4 K and 50 mK. An inset shows a schematic of the device geometry 171. The magnetoresistance of the square device in FIG. 17(a) shows a peak centered around B=0 that becomes more pronounced as the sample is cooled to 50 mK. Note that the peak resistivity is similar at both temperatures, as expected for a highly doped metallic system.

The strong increase in the magnitude of the negative magnetoresistance with decreasing temperature is a characteristic signature of weak localization. Weak localization arises from coherent backscattering of forward and time reversed electron waves around a loop as electrons diffuse through the sample, leading to an increase of the resistance over the classical Drude value. This quantum correction to the resistance becomes larger as the temperature is lowered, because the phase coherence length increases as T→0 and more loops (with larger circumferences) can contribute to the total backscattering. The application of a magnetic field breaks the time reversal symmetry in these loops and suppresses coherent backscattering, resulting in a negative magnetoresistance that is more pronounced at lower temperatures.

We can extract the phase coherence length of the electrons by performing a three-parameter fit of the magnetoresistance (see dotted lines) to the Hikami expression for weak localization in the diffusive regime. At 4 K we obtain a phase coherence length of $l_\phi=38$ nm, which increases to $l_\phi=131$ nm as the temperature is reduced to 50 mK. This suggests that if we make a STM-defined structure with a width below w ~130 nm, we would expect to see evidence of the lateral confinement in the weak localization, that is in the magnetoresistance.

In FIG. 17(b) we present the magnetoresistance of the 90 nm-wide quantum wire device. An inset shows the device geometry 172. We can see that the overall resistance of the wire is much higher than the square device, as expected from the sample geometry. At 4 K the resistance of the wire device shows a similar peak in the magnetoresistance around B=0. From fitting the data to the Hikami formula for weak localization we can again extract the phase coherence length $l_\phi$, which is smaller than the width of the wire. Electron transport in the wire is essentially two-dimensional, as electrons are unable to distinguish if they are traveling through a 4 μm-wide square or a 90 nm-wide wire. As the temperature is reduced to 50 mK however, $l_\phi$ becomes larger than the wire width, and the lateral confinement of the wire limits the maximum size of electron loops that can contribute to the backscattering mechanism that causes weak localization. Thus although the negative magnetoresistance becomes stronger in the wire as T is reduced, it is significantly less pronounced than for the square device. This is highlighted if we consider the 2D Hikami fit applied to the wire. Here we can clearly see a suppression of the 2D weak localization around B=0 due to a cross-over from two-dimensional to one-dimensional electron transport as the phase coherence length increases.

We can use the suppression of the 2D weak localization to independently measure the width of the quantum wire. As the magnetic field is increased, the maximum size of electron loops for which there is constructive interference of backscattered electrons decreases. The constructive interference is destroyed when a magnetic flux quantum threads a loop of radius r, that is when $r^2=\hbar/(eB)=l_B^2$. When the magnetic length $l_B$ is much larger than the wire width w, the magnetic field has relatively little effect, which results in the plateau around B=0. As the magnetic field increases the size of the constructively interfering loops becomes smaller, so that it is B, and not the wire width, that determines the magnitude of the weak localization effect. Thus the wire approaches the two-dimensional behavior of the square when $2l_B$~w. From FIG. 17(b) we see that the measured data merges with the dashed line of the 2D theory at |B|~0.3 T, which implies a wire width of ~90 nm, in excellent agreement with the STM-defined geometry.

FIG. 17(c) is a graph of magnetoresistance of a 310×50 nm² buried P doped wire at 4 K sample temperature. The 2D weak localisation fit confirms a phase coherence length of ~30 nm.

FIG. 17(d) is a graph of magnetoresistance of a 310×28 nm² buried P doped wire at 4 K sample temperature. The 2D weak localisation fit is not applicable at this temperature as the wire width is similar to the phase coherence length.

Our results open the way for the realization of sophisticated atomic and nano-scale devices in silicon such as single electron transistors (SETs), quantum cellular automata and a Si based solid-state quantum computer.

We will now describe more work for which we have used a new STM-MBE system which has a combined SEM and STM, for imaging registration markers with the SEM and or optical microscope and then bringing the very delicate STM tip down at a precise location with respect to the markers. A laser interferometer stage allows precise movement of the STM over millimeter distances with nanometer resolution to position and relocate patterned devices with respect to the registration markers. Extreme anti-vibration measures have been taken to decouple the atomic resolution STM chamber from the resonating MBE growth chamber and its associated pumps since both technologies are needed to fabricate the complete device.

Figure 18:
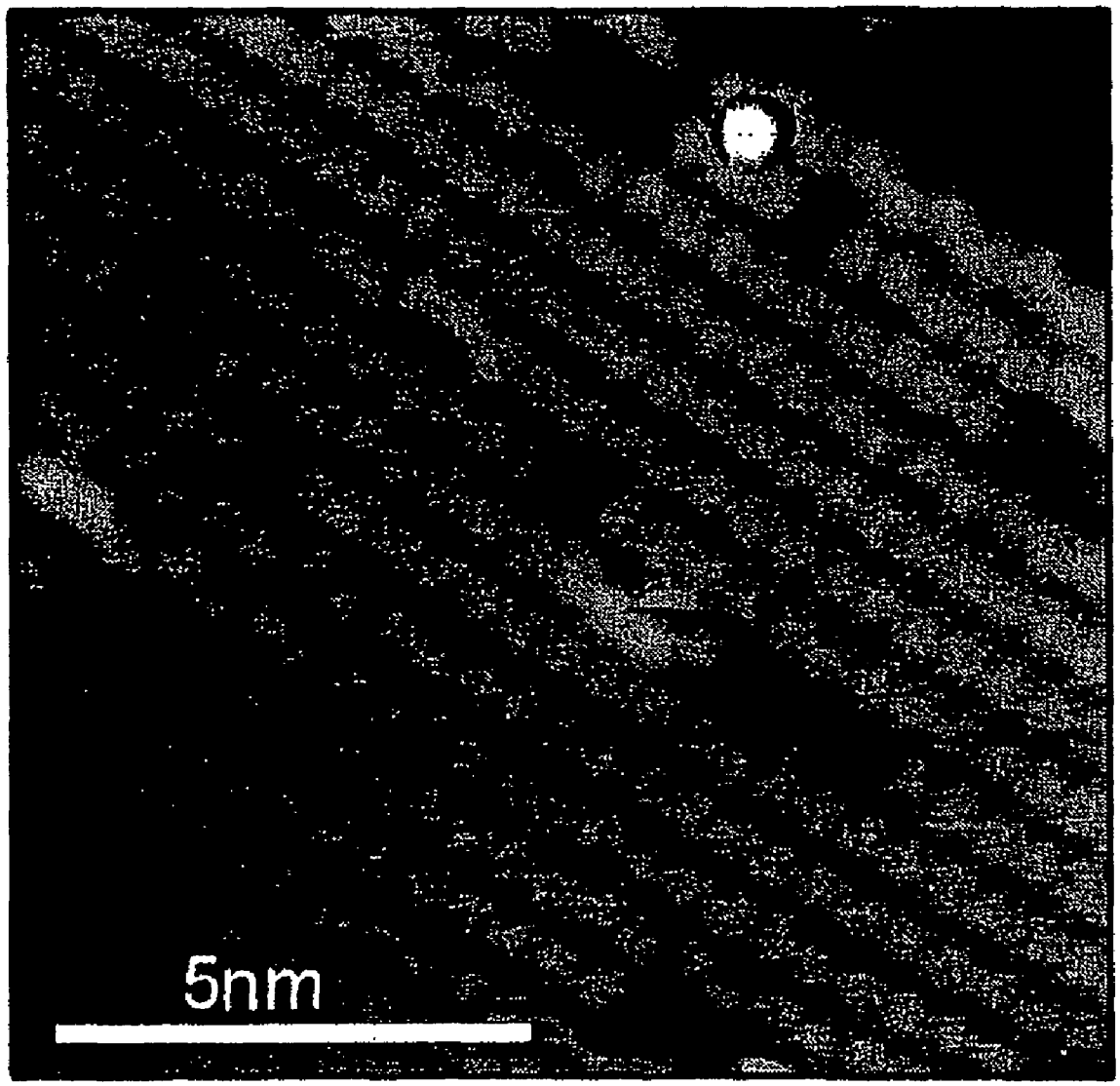
FIG. 18 is an STM image showing the atomic resolution capability of the STM-SEM system on 1×1 cm$^2$ sized silicon chips.

The system is capable of dealing with 1 cm² samples (~5× larger than normal STM samples) using a special e-beam heater to prepare the atomically flat (100) silicon surface. These large sample sizes are more compatible with standard cleanroom processing. FIG. 18 is a STM image showing the atomic resolution capability of the system on a 1×1 cm² silicon chip.

The results we have achieved are the following:
1. We have used an STM to create an atomically perfect nanoscale device in silicon, namely a quantum wire.
2. We have successfully connected this STM-fabricated device to the outside world with a full set of 4-terminal voltage and current leads.
3. We have shown that the complete fabrication scheme works, and have made a number of control devices that show the difference between large area (micron scale) STM-defined devices, and nanostructures.
4. We have demonstrated quantum transport in the STM-defined wire, and used electrical measurements to independently determine the width of the quantum wire which is shown to be in excellent agreement with the STM fabrication and imaging.
5. We have aligned surface gate electrodes above buried STM patterned tunnel junctions in order to control the height of tunnel barriers.

These results mean that it is now possible to use a STM to build robust semiconductor devices. Given that we have also recently demonstrated that it is possible to dope silicon with atomic precision with a STM, the door is now open to the creation of fully functional atomic scale silicon devices. This promises to open entirely new areas of quantum device physics, due to the ability to control the position of dopants with atomic precision, and integrate quantum physics into device design (with applications for nano and atomic scale transistors, stub tuners, resonant tunnel diodes, etc). It may also have significant implications for the future of the semiconductor industry (with potential for lower power operation and greater device reproducibility, two key issues facing the industry). Although STM fabrication may initially appear to be incompatible with mass manufacture, the same was initially said of MBE in the early 1980's. Today MBE is a standard industry tool, and widely used for high-speed electronics, microwave communication systems, laser diodes, etc.

Figure 19:
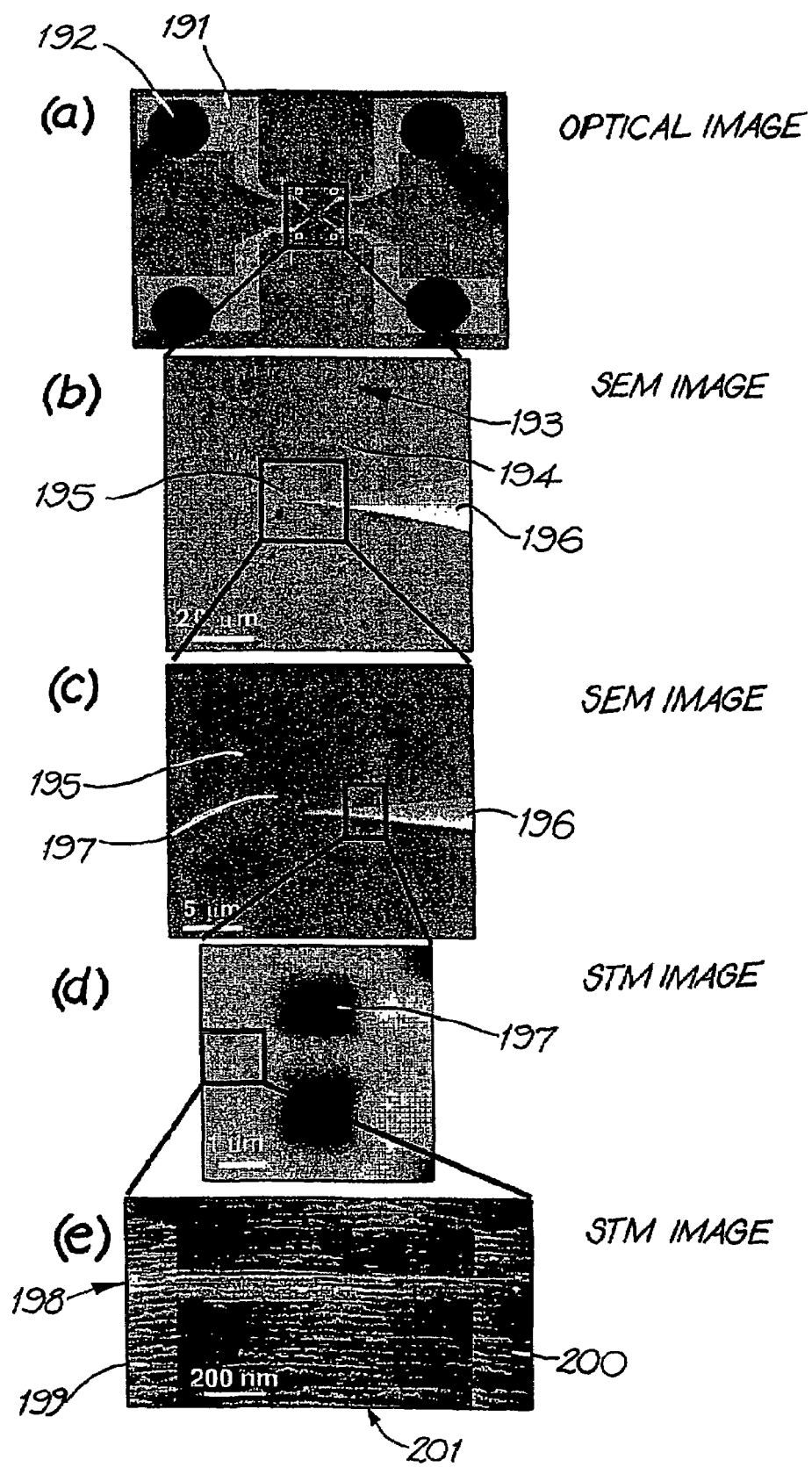
FIG. 19(a) to (e) is a series of optical microscope, SEM and STM images showing the registration process using registration markers created by optical lithography from the final device to the STM lithography step.

FIG. 19(a) is an optical microscope image of the final device including metal contacts 191 and bond balls 192.

FIG. 19(b) is an SEM image of registration markers created by optical lithography and wet chemical etching. There are three sets of markers visible in this image: The most visible are four large markers, one of which is 193. There are four smaller markers, one of which is 194, within the area of the four largest markers. Within the area of the smaller markers are four even smaller markers, one of which is 195. All the markers are approx. 300 nm deep. The STM tip 196 is approached to the sample surface near the center of the registration markers.

FIG. 19(c) is an SEM image of the center registration markers 195 with the STM tip 196 approached to the surface. The region in-between the four smallest, 1 µm wide markers 197 is used for the lithographic structuring of the hydrogen resist layer on the Si(001) surface.

FIG. 19(d) is an STM image of two 1 µm wide registration markers 197 after flashing.

FIG. 19(e) is an STM image of the lithographically structured hydrogen terminated Si(001) surface showing a 90-nm-wide wire 198 with two contact areas 199 and 200. The hydrogen terminated areas appear dark, see 201, in the image.

Figure 20:
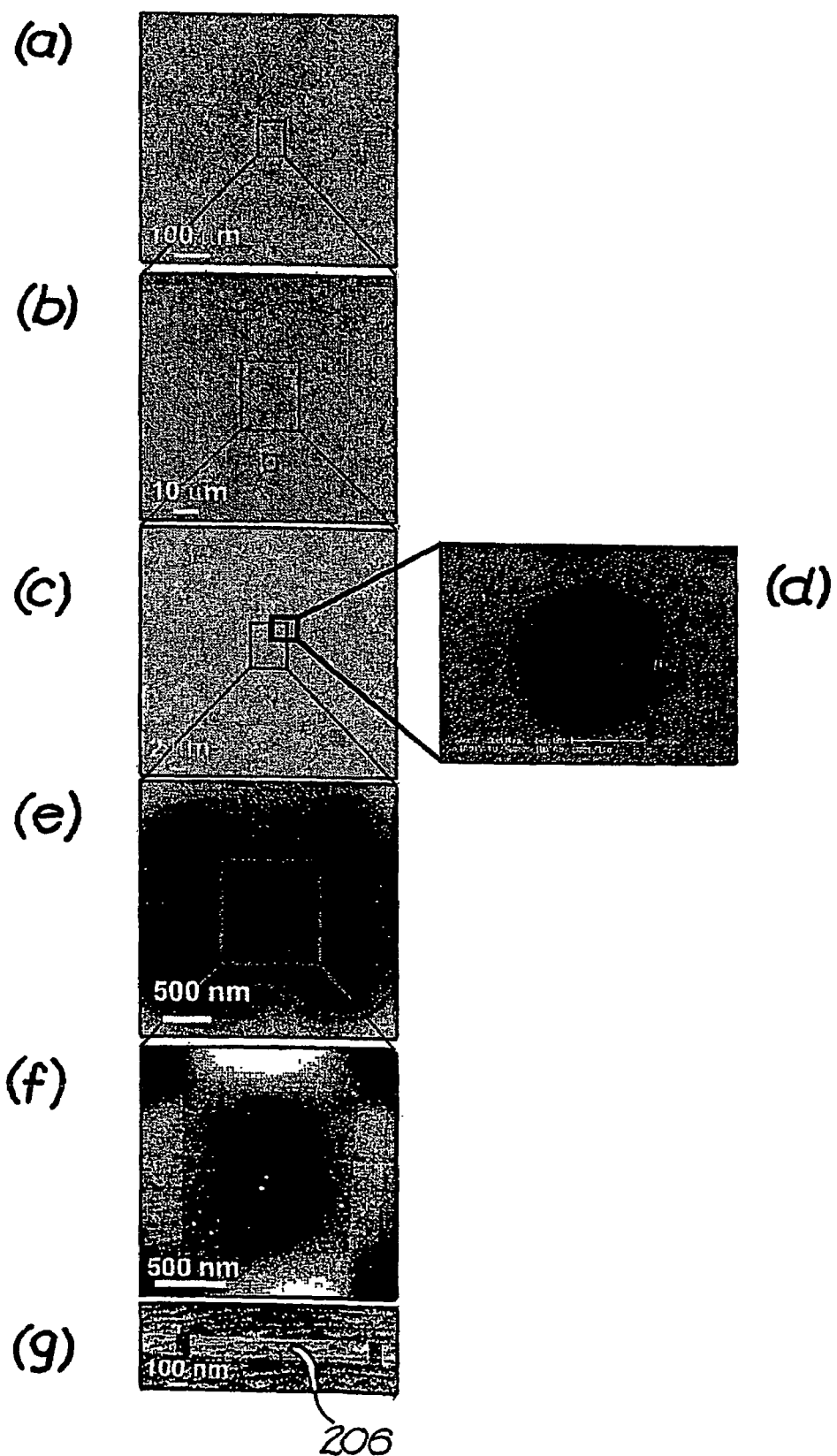
FIG. 20(a) to (g) is a series of SEM and STM images showing the registration process from large scale registration markers to the STM lithography step.

FIG. 20(a) to (d) are SEM images of differently sized registration markers created by EBL and wet chemical etching. The markers are approx. 300 nm deep. The smallest markers, one of which is shown in FIG. 20(d), have a diameter of approx. 200 nm.

FIG. 20(e) is an STM image of the four smallest registration markers after sample flashing. The apparent depth of the markers has decreased to approx. 30 nm.

FIGS. 20(f) and (g) are STM images of the region in-between the smallest registration markers. This region has been used to structure the hydrogen terminated Si(001) surface to form an SET structure which consists of a 100 nm wide wire with two 50 nm wide gaps such that a 600 nm long island 206 is formed and contact areas.

FIG. 21(a) to (d) show wires 210, 211, 212 and 213 of width 90, 50, 28 and 6 nm, respectively, with µm-sized contact areas, such as 214 and 215.

Figure 21:
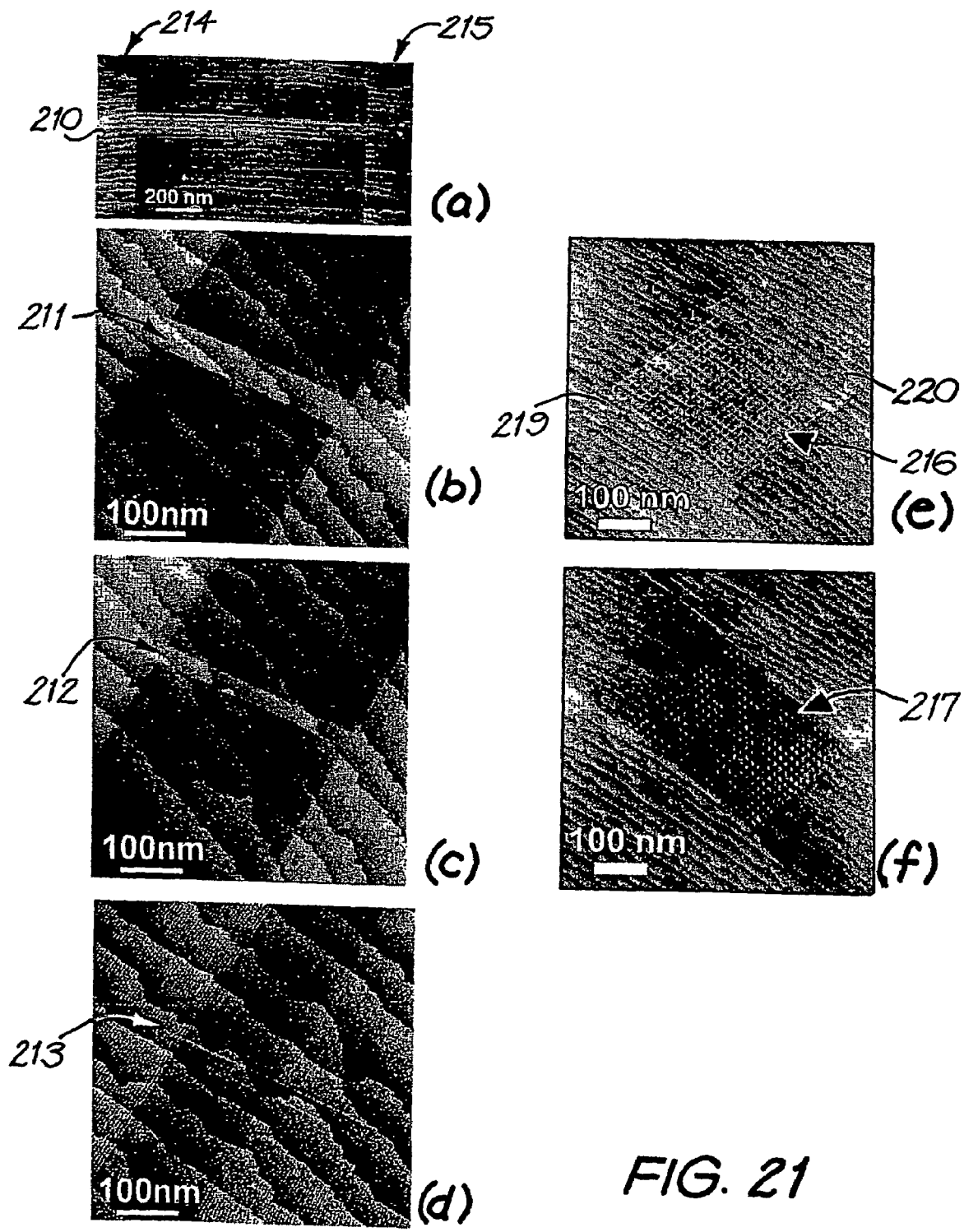
FIG. 21(a) to (f) is a series of STM images of the nanostructured hydrogen terminated Si(001) surface showing various device structures.

FIGS. 21(e) and (f) show arrays of lines and dots, such as 216 and 217, in-between contact areas, such as 219 and 220.

Figure 22A:
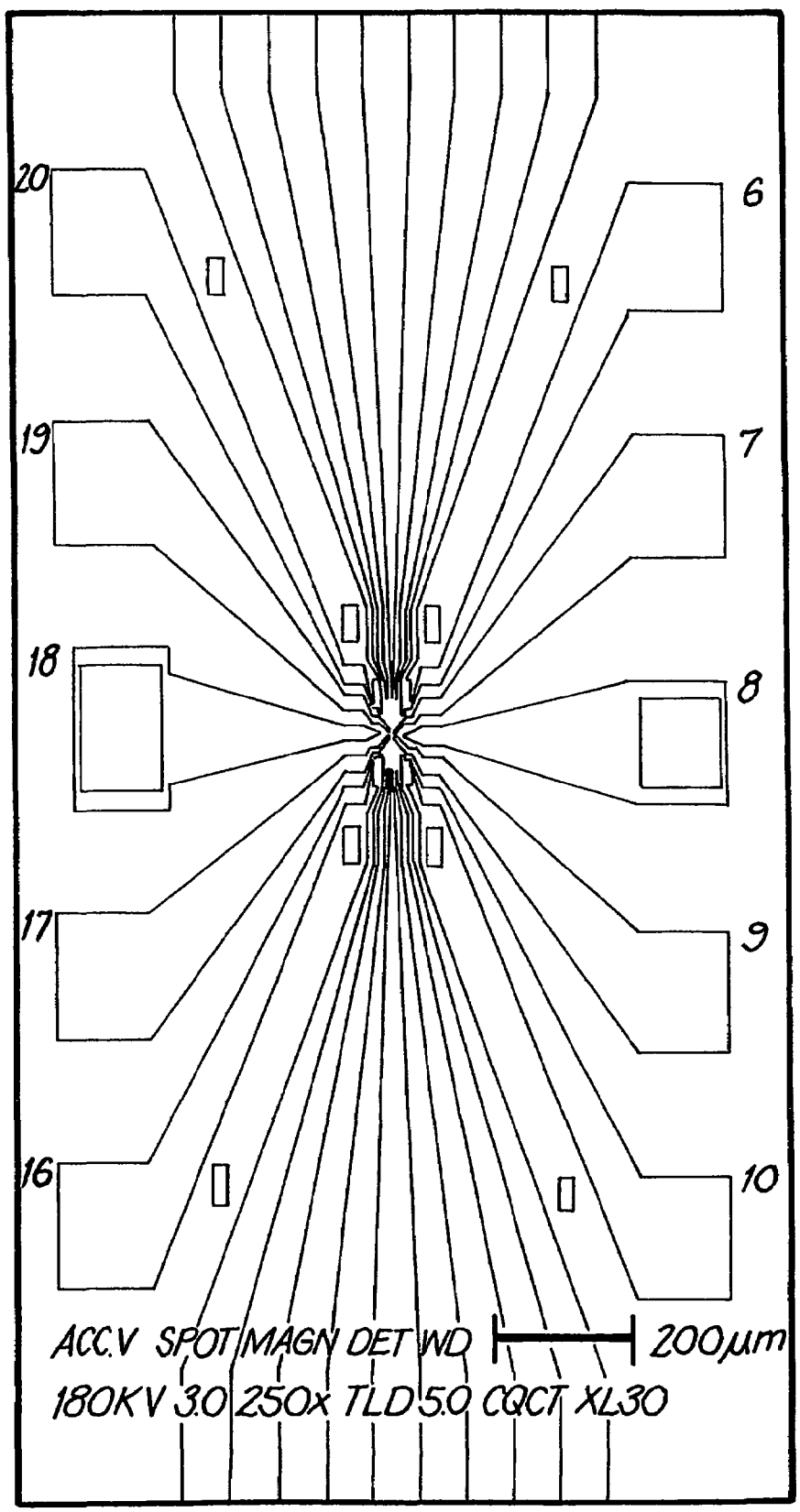
FIG. 22(a) is an SEM image of a completed Si:P nanoscale device.

FIG. 22(a) is a SEM image of a completed Si:P nanoscale device showing large contacts pads created by optical lithography which are connected to four ohmic contacts and three surface metal gates created by EBL in the centre.

Figure 22B:
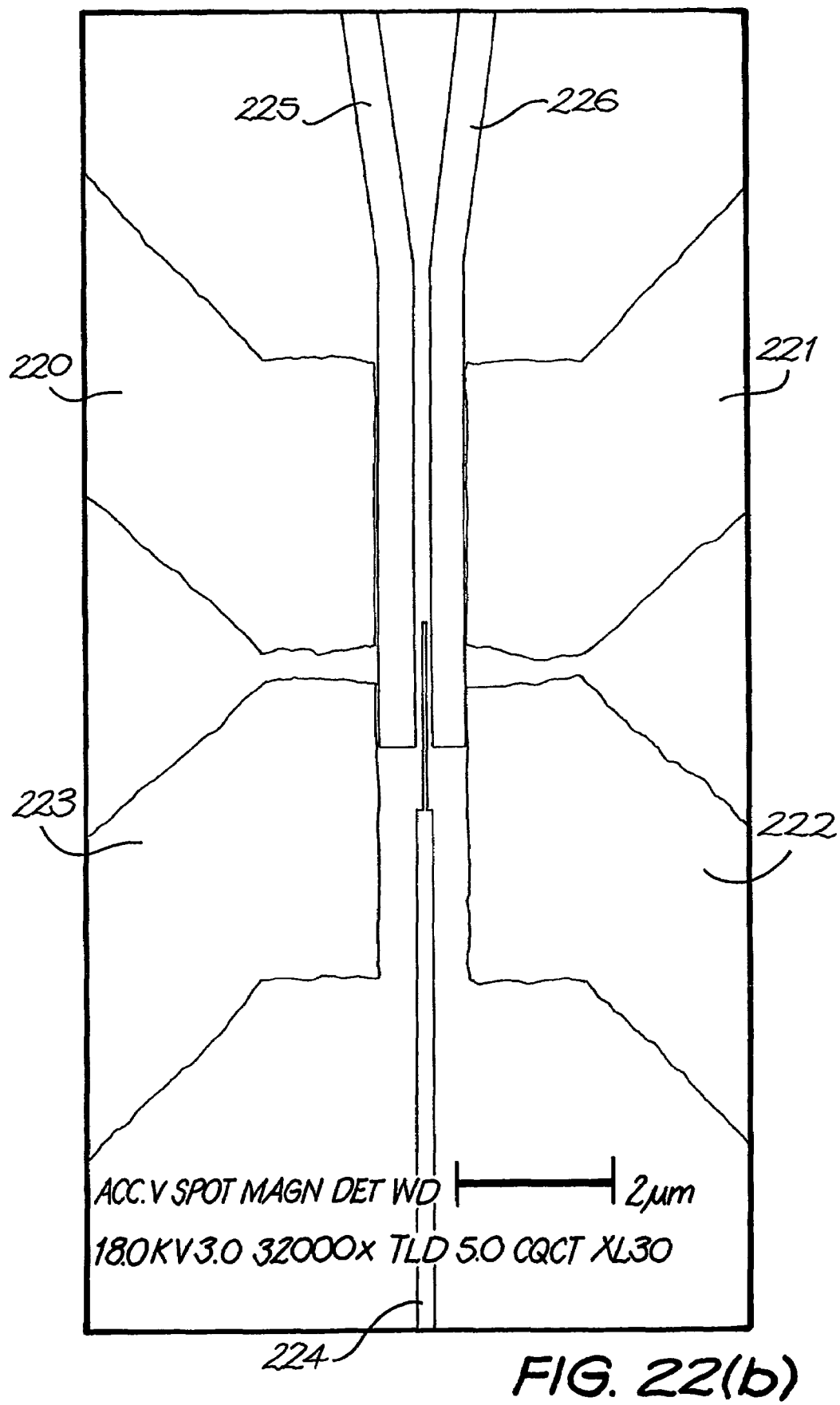
FIG. 22(b) is a magnification of it.
Figure 22:
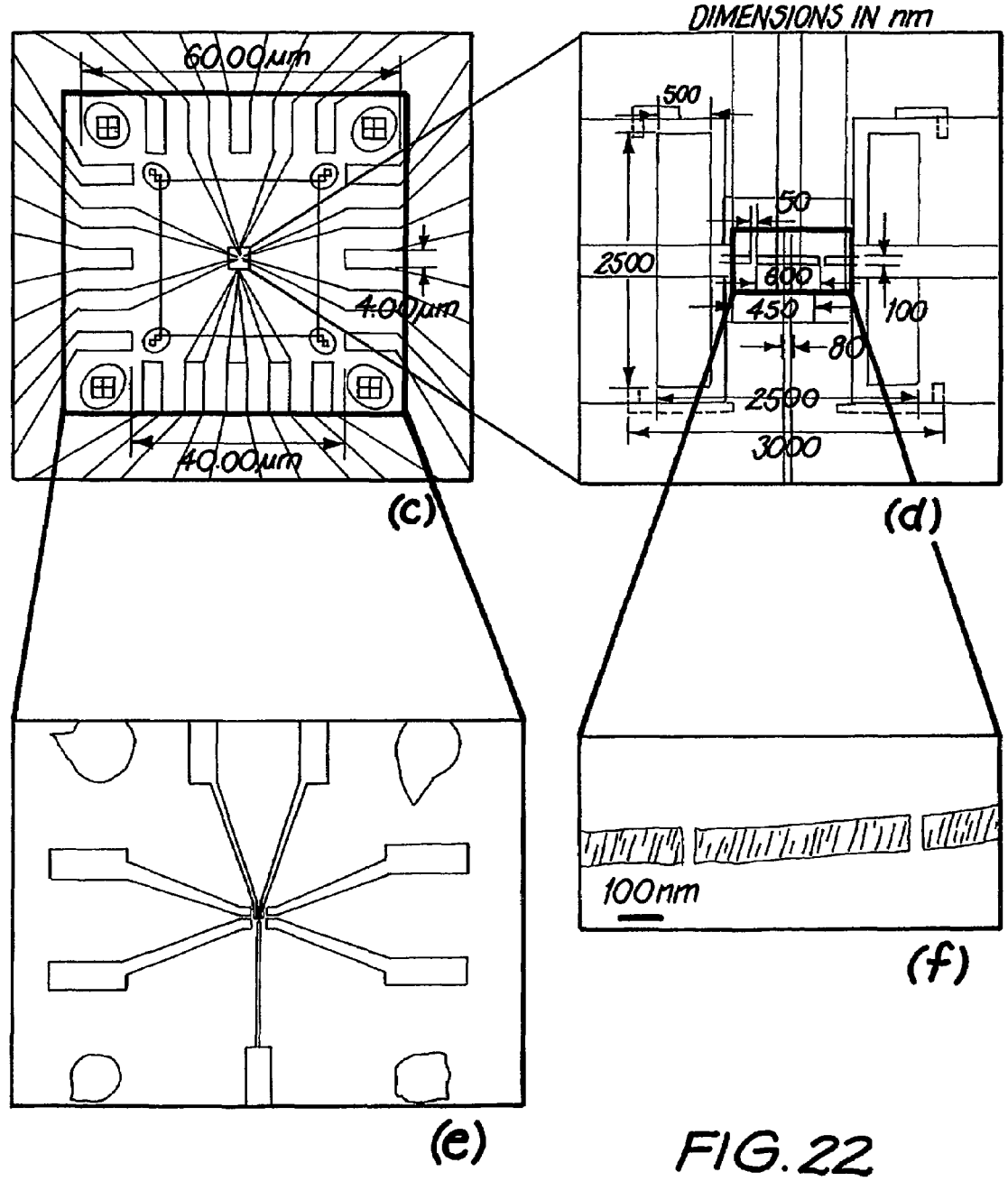
FIG. 22(c) is a schematic of the metal contact layout.
FIG. 22(d) is a schematic of the buried nanostructure.
FIG. 22(e) is a SEM image of magnification intermediate FIGS. 22(a) and (b).
FIG. 22(f) is a STM image of the Si(001) surface.

FIG. 22(b) is a higher magnification SEM image of the central area of FIG. 22(a) of a completed Si:P nanoscale device encapsulated by 25 nm of epitaxial silicon. The image shows four metal contact leads 220, 221, 222 and 223 for fill four terminal measurements. It also shows three metal surface gates 224, 225 and 226 aligned to the buried nanostructure. The gates are separated from the contacts and the silicon surface by a 20 nm thin $SiO_2$ grown using PECVD.

FIG. 22(c) is a schematic of the metal contact layout. FIG. 22(d) is a schematic of the buried nanostructure with metal contacts, STM fabricated nanostructure, ohmic contacts, and surface metal gates. FIG. 22(e) is a SEM image of ohmic contacts and gate electrodes contacting the buried nanostructure having magnification intermediate that of FIGS. 22(a) and (b). FIG. 22(f) is a STM image of the lithographically structured hydrogen terminated Si(001) surface showing a 100 nm wide wire with two 50 nm long gaps such that a 600 nm long island is formed.

Finally, it is important to note that the fabrication strategy demonstrated here is also directly applicable to other silicon based quantum computer architectures[3].

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

The invention claimed is:

1. A method for fabricating a nanoscale or atomic scale device, comprising the steps of: creating one or more registration markers visible to a Scanning Tunnelling Microscope (STM), Scanning Electron Microscope (SEM) or an optical microscope, on or in a (clean) silicon surface; using a SEM or optical microscope to form an image of at least one of the registration markers and the tip of a Scanning tunnelling Microscope (STM) in the vicinity of the registration marker; using the image to position and reposition the STM tip relative to the marker with nanometer or micron resolution in order to pattern the active region of the device structure on the silicon surface; the device and then encapsulating it with silicon such that one or more of the registration markers are still visible on the silicon surface to a SEM or optical microscope; depositing a metal layer onto the silicon surface using either optical or electron beam lithography to form one or more ohmic or gate electrodes, or both, at one or more locations positioned relative to respective registration markers.

2. A method according to claim 1, wherein the silicon surface is the (100)-oriented surface having a 2×1 unit cell surface structure with rows of s-bonded silicon dimers.

3. A method according to claim 1, wherein the silicon surface is up to 1 cm² in size.

4. A method according to claim 1, wherein the registration markers are defined by optical or e-beam lithography (EBL).

5. A method according to claim 1, wherein the registration markers are created using focused ion beam (FIB) milling or etching of the silicon surface.

6. A method according to claim 1, wherein the registration markers are created using wet-chemical etching or reactive ion etching (RIE).

7. A method according to claim 1, wherein the registration markers are created by depositing metal onto the silicon surface.

8. A method according to claim 1, wherein the markers are sized between a few nm and several microns.

9. A method according to claim 1, wherein a series of registration marker of different sizes and patterns are created to form a target around a selected site for the nanoscale device.

10. A method according to claim 9, wherein the smallest marker ranges from tens to several hundred nanometers in diameter.

11. A method according to claim 1, wherein the registration markers are from tens to several hundred nanometers deep.

12. A method according to claim 1, wherein after creating the markers the silicon surface is cleaned to remove any traces or organic resists before loading into the STM vacuum system.

13. A method according to claim 1, wherein a laser interferometer stage is used to assist with repositioning of the STM over millimeter distances with nanometer resolution.

14. A method according to claim 1, wherein the structure is patterned by selectively desorbing atoms from a hydrogen monolayer on a silicon surface.

15. A method according to claim 14, wherein the exposed silicon is subsequently doped by exposure to gas atoms or molecules containing dopant atoms.

16. A method according to claim 15, wherein dopant atoms are activated by annealing the surface at between about 300° C. and about 650° C. to incorporate electrically active dopant atoms into the silicon.

17. A method according to claim 16, wherein the hydrogen monolayer is removed byannealing at ~470±30° C. for less than 10 seconds.

18. A method according to claim 15, wherein annealing takes place at about 530° C. for about 5 seconds.

19. A method according to claim 16, wherein the hydrogen monolayer is removed using the STM tip.

20. A method according to claim 16, wherein the hydrogen monolayer is removed using the SEM.

21. A method according to claim 1, wherein encapsulating layers are epitaxially grown at between about 0° C. and 400° C.

22. A method according to claim 21, wherein the encapsulating layers are grown at between about 0° C. and 250° C.

23. A method according to claim 22, wherein the encapsulating layers are grown at room temperature.

24. A method according to claim 1, wherein the encapsulating layers between 5 and several hundred nm thick.

25. A method according to claim 1, including the further step of: thermally annealing the surface so that it becomes atomically smooth.

26. A method according to claim 1, including the further step of forming highly-doped gate regions close to and in the plane of the patterned device structure.

27. A method according to claim 26, including the further steps of: depositing metal layers on the silicon surface at locations positioned above respective highly-doped regions and then annealing to diffuse the metal down to the highly-doped regions.

28. A method according to claim 27, wherein the anneal is conducted at a sufficiently low temperature that significant dopant diffusion does not occur.

29. A method according to claim 1, including the further step of implanting dopants to create a doped region extending from the surface down to the layer of the patterned device structure.

30. A method according to claim 1, including the further step of forming a three dimensional device by patterning a first layer of the device structure, then forming that device layer and overgrowing with one or more layers of silicon atoms and patterning the new surface with another layer of the device structure.

31. A method according to one of claims 1 to 28, including the further step of measuring the electrical activity of the device.

* * * * *